(12) United States Patent
Steinberg

(10) Patent No.: US 7,157,016 B2
(45) Date of Patent: Jan. 2, 2007

(54) ETCHING PROCESS FOR MICROMACHINING CRYSTALLINE MATERIALS AND DEVICES FABRICATED THEREBY

(75) Inventor: Dan A Steinberg, Blacksburg, VA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 320 days.

(21) Appl. No.: 10/860,809

(22) Filed: May 24, 2004

(65) Prior Publication Data

US 2005/0001282 A1 Jan. 6, 2005

Related U.S. Application Data

(60) Provisional application No. 60/472,910, filed on May 23, 2003, provisional application No. 60/472,909, filed on May 23, 2003.

(51) Int. Cl.
 *B44C 1/22* (2006.01)
 *B29D 11/00* (2006.01)
 *C03C 15/00* (2006.01)
 *C03C 25/68* (2006.01)
 *C23F 1/00* (2006.01)

(52) U.S. Cl. .......................................... 216/24; 216/57

(58) Field of Classification Search ................. 216/24, 216/99, 57; 438/700, 753; 385/49
See application file for complete search history.

(56) References Cited

U.S. PATENT DOCUMENTS

| 4,021,097 A | 5/1977 | McMahon |
| 4,181,400 A | 1/1980 | Malsot et al. |
| 4,225,213 A | 9/1980 | McBride, Jr. et al. |
| 4,253,735 A | 3/1981 | Kawamura et al. |
| 4,362,367 A | 12/1982 | Hammer et al. |
| 4,411,057 A | 10/1983 | Duda et al. |
| 4,601,541 A | 7/1986 | Shaw et al. |
| 4,611,884 A | 9/1986 | Roberts |
| 4,683,560 A | 7/1987 | Takeuchi et al. |
| 4,706,061 A | 11/1987 | Johnson |
| 4,784,721 A | 11/1988 | Holmen et al. |
| 4,810,557 A | 3/1989 | Blonder |
| 4,812,002 A | 3/1989 | Kato et al. |
| 4,830,450 A | 5/1989 | Connell et al. |
| 4,837,129 A | 6/1989 | Frisch et al. |
| 4,863,560 A | 9/1989 | Hawkins |
| 4,897,711 A | 1/1990 | Blonder et al. |
| 4,904,036 A | 2/1990 | Blonder |
| 4,938,841 A | 7/1990 | Shahar et al. |
| 4,945,400 A | 7/1990 | Blonder et al. |
| 4,957,592 A | 9/1990 | O'Neill |
| 5,024,500 A | 6/1991 | Stanley et al. |
| 5,073,003 A | 12/1991 | Clark |
| 5,095,386 A | 3/1992 | Scheibengraber |
| 5,135,590 A | 8/1992 | Basavanhally et al. |

(Continued)

OTHER PUBLICATIONS

European Search Report of corresponding European Application No. EP 04 25 2983, filed May 21, 2004.

(Continued)

*Primary Examiner*—Parviz Hassanzadeh
*Assistant Examiner*—Roberts Culbert
(74) *Attorney, Agent, or Firm*—Jonathan D. Baskin

(57) ABSTRACT

The present invention relates generally to micromachining. More particularly, the present invention relates to a method for combining directional ion etching and anisotropic wet etching and devices and structures fabricated thereby. The present invention is particularly applicable to silicon micromachining and provides architectures that combine crystallographic surfaces and vertical dry etched surfaces together in the same structure.

8 Claims, 38 Drawing Sheets

U.S. PATENT DOCUMENTS

| | | | |
|---|---|---|---|
| 5,281,301 A | 1/1994 | Basavanhally |
| 5,338,400 A | 8/1994 | Jerman |
| 5,339,377 A | 8/1994 | Takahashi |
| 5,357,593 A | 10/1994 | Bossler |
| 5,381,231 A | 1/1995 | Tu |
| 5,384,872 A | 1/1995 | Jacobs-Cook et al. |
| 5,440,657 A | 8/1995 | Essert |
| 5,478,438 A | 12/1995 | Nakanishi et al. |
| 5,479,426 A | 12/1995 | Nakanishi et al. |
| 5,507,911 A | 4/1996 | Greiff |
| 5,611,006 A | 3/1997 | Tabuchi |
| 5,748,822 A | 5/1998 | Miura et al. |
| 5,760,305 A | 6/1998 | Greiff |
| 5,771,322 A | 6/1998 | Matsumoto et al. |
| 5,781,675 A | 7/1998 | Tseng et al. |
| 5,844,723 A | 12/1998 | Snyder |
| 5,852,308 A | 12/1998 | Wood |
| 5,886,249 A | 3/1999 | Bonne et al. |
| 5,896,481 A | 4/1999 | Beranek et al. |
| 5,911,021 A | 6/1999 | MacDonald et al. |
| 5,966,493 A | 10/1999 | Wagoner et al. |
| 5,987,202 A | 11/1999 | Gruenwald et al. |
| 6,023,546 A | 2/2000 | Tachigori |
| 6,088,168 A | 7/2000 | Snyder |
| 6,132,107 A | 10/2000 | Morikawa |
| 6,146,917 A | 11/2000 | Zhang et al. |
| 6,187,515 B1 | 2/2001 | Tran et al. |
| 6,212,320 B1 | 4/2001 | Rickman et al. |
| 6,257,772 B1 | 7/2001 | Nakanishi et al. |
| 6,428,053 B1 | 8/2002 | Tai et al. |
| 6,511,235 B1 | 1/2003 | Wu et al. |
| 6,548,371 B1 | 4/2003 | Fujimaki |
| 6,553,173 B1 | 4/2003 | Goto |
| 6,567,590 B1 | 5/2003 | Okada et al. |
| 2002/0195417 A1 | 12/2002 | Steinberg |
| 2003/0020130 A1 | 1/2003 | Steinberg et al. |
| 2003/0021572 A1 | 1/2003 | Steinberg |
| 2003/0034438 A1 | 2/2003 | Sherrer et al. |
| 2003/0059622 A1 | 3/2003 | Steinberg et al. |
| 2003/0067049 A1 | 4/2003 | Steinberg et al. |

OTHER PUBLICATIONS

Brugger, J., et al., "Self-aligned 3D shadow mask technique for patterning deeply recessed surfaces of micro-electro-mechanical systems devices", Sensors and Actuators 76, pp. 329-334. 1999.

Fleming, J.G., "Combining the best of bulk and surface micromachining using Si{111}substrates", SPIE vol. 3511, pp. 162-168. Sep. 1998.

Madou, Marc, "Fundamentals of Fabrication", CRC Press, pp. 174-178, 1997. ADOU.

Nijdam,A. Jasper, et al., "Etching of silicon in alkaline solutions: a critical look at the {111}minimum", MESA Research Institute for Micro Electronics Materials.

Oosterbroek, R. E., et al., "New design methodologies in <111> oriented silicon wafers", MESA Research Institute for Micro Electronics Materials Engineering, Sensors & Actuators.

Van Suchteien, J., et al., "Simulation of Anisotropic Wet-Chemical Etching Using a Physical Modal", MESA Research Institute for Micro Electronics Materials Engineering, Sensors.

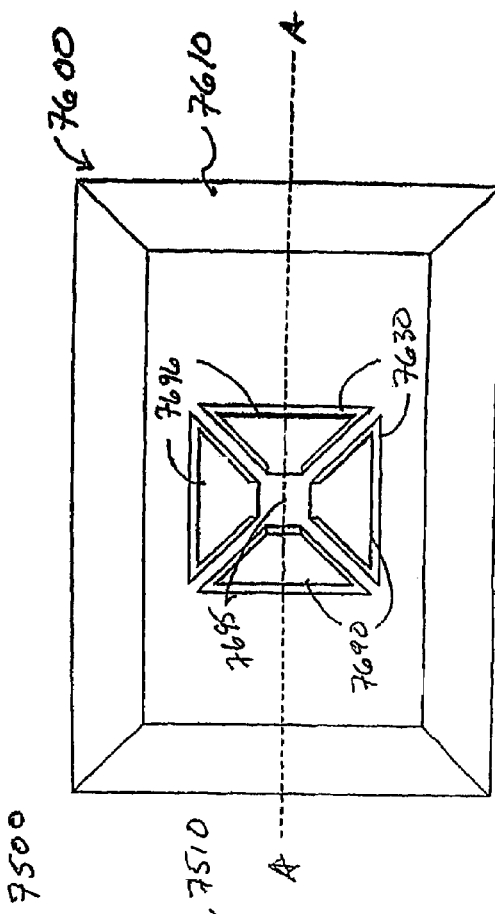
Fig. 73A
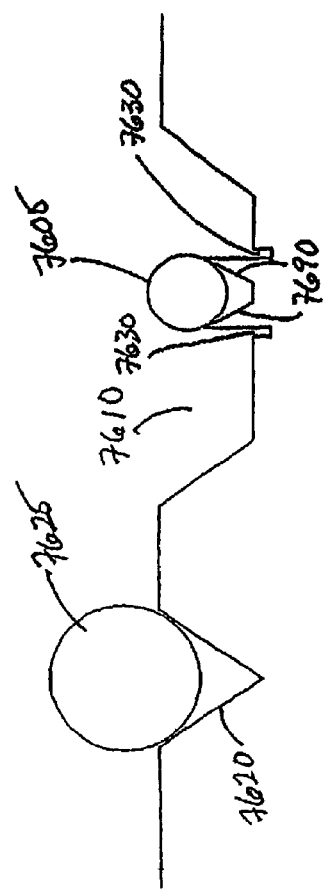
Fig. 73C
Fig. 73B
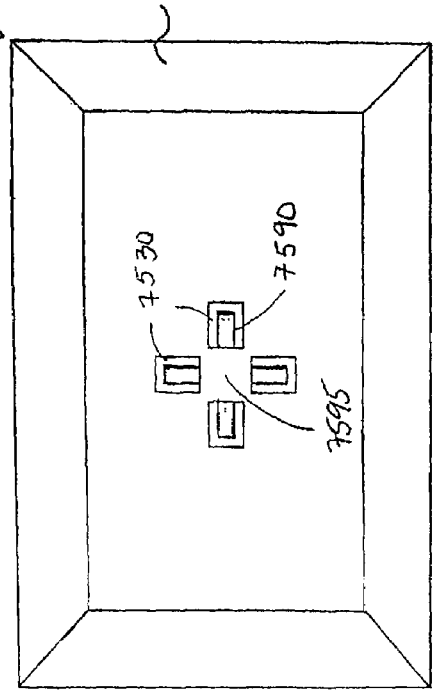
Fig. 72

ETCHING PROCESS FOR MICROMACHINING CRYSTALLINE MATERIALS AND DEVICES FABRICATED THEREBY

RELATED APPLICATIONS

This application claims the benefit of priority of U.S. Provisional Application No. 60/472,910 filed on May 23, 2003 and U.S. Provisional Application No. 60/472,909 filed on May 23, 2003, the entire contents of which applications are incorporated herein by reference. This application is related to the subject matter of U.S. application Ser. No. 10/860,811 filed on May 24, 2004.

FIELD OF THE INVENTION

The present invention relates generally to micromachining. More particularly, the present invention relates to a method for combining directional ion etching and anisotropic wet etching and devices and structures fabricated thereby. The present invention is particularly applicable to silicon micromachining.

BACKGROUND OF THE INVENTION

The art of bulk micromachining in silicon has changed since the invention of practical means to etch vertical sidewalls in silicon using dry etching technology, as has largely resulted from the invention of the BOSCH process. Deep dry etching technology has allowed new architectures in single crystal silicon to be created, especially in released structures such as those based on SOI silicon like accelerometers and electrostatic actuators. While such deep dry etch processes have allowed the realization of many new architectures, there are still advantages in traditional crystallographic (anisotropic) etching in silicon. Wet anisotropic etching is often based on opening a hard mask deposited on silicon, with features oriented on the surface to create v-grooves, u-grooves, precision inverted pyramidal pits, and other shapes, which are well known in the art. The exact shapes depending on the crystal orientation, mask opening shape, and particular wet etch used. Advantages of wet etching, with proper alignment and etch conditions, include the ability to batch process many wafers at one time, the ability to achieve very smooth surfaces, and the ability to achieve non perpendicular surfaces such as v-grooves, and the ability to produce highly accurate mechanical dimensions. Alternatively, the use of deep plasma etching has the advantage of being independent of crystallographic axis limitations and allows vertical surfaces to be created with high aspect ratio. What is lacking in the art is a method to combine these two etching formats so that the benefits of both techniques can be brought together allowing new freedom in possible resulting shapes and structures. Combining these to etching formats would be particularly useful for the art of silicon optical bench, where elements such as micro-optics, semiconductor lasers, photodetectors, optical fibers, and other elements can be hybridly integrated on the silicon wafer surface using mechanical features etched into the silicon, along with integrated patterned metals, solders, resistors, and MEMS that can be fabricated directly into or onto the silicon wafer. Thus microsystems can be achieved with assembly economy difficult to otherwise achieve. It should be clear that other such wafer level micro-systems will clearly benefit from this improvement in micromachining technology such as sensors, actuators, micro-fluidics, RF microdevices, and so on. For example, can apply the methods of the present invention to the fabrication of known bulk micromachined products such as accelerometers to create architectures leveraging dry and wet etching. By way of example and not limitation, the instant disclosure describes mechanical structures which can be realized and that are useful in hybrid micro-optical electrical systems, also known as silicon optical bench, SiOB, silicon wafer board, or simply silicon bench.

The ability to precisely locate optical elements relative to one another is of critical importance in the fabrication of micro-optical devices, since the alignment tolerances between elements are often specified in submicron dimensions. Typically, such elements may include an optical signal source, such as a laser, a detector, and an integrated or discrete waveguide, such as a fiber-optic, integrated optics, or GRIN rod lens. Additionally, such elements may include a fiber amplifier, optical filter, modulator, grating, ball lens, or other components for conveying or modifying or splitting an optical beam. Micro-optical devices containing such components are crucial in existing applications such as optical communication and consumer opto-electronics, as well as applications currently being developed, such as optical computing.

Maintaining precise alignment among the optical elements may be conveniently provided by an optical microbench, such as a silicon optical bench. An optical microbench comprises three-dimensional structures having precisely defined surfaces onto which optical elements may be precisely positioned. One material well-suited for use as an optical microbench is single crystal silicon, because single crystal silicon may be etched anisotropically to yield three-dimensional structures having planar sidewalls formed by the precisely defined crystallographic planes of the silicon. For example, the {111} silicon plane is known to etch more slowly than the {100} or {110} planes with proper choice of etchant. Thus, structures may be formed comprising walls that are primarily {111} planes by anisotropic etching.

Since the many optical elements sit within the three-dimensional structures at a position at least partially below a top surface of the silicon substrate, a portion of the optical path often lies below the top surface of the substrate, within the volume of the substrate. Accordingly, passageways must be provided in the optical microbench between three-dimensional structures so that light may travel between the elements disposed in the associated three-dimensional structures. Hence, an optical microbench should contain three-dimensional structures that communicate with one another through structures such as a passageway.

While discrete, non-communicating, three-dimensional structures may be conveniently formed by an anisotropic etching, etched structures which communicate with one another at particular geometries, such as a convex corner, pose significant problems for applications in which it is desirable to maintain the precise geometry defined by the crystallographic planes. For example, where two {111} planes intersect at a convex (or exposed) corner, the convex corner does not take the form of a straight line intersection between two planes, but is rather rapidly attacked by the etchant to create a rounded or complex intersection between the two {111} planes. As etching continues to reach desired depth of the structure containing the {111} planes, the rounding or attack of the corners can grow to such an extent that a substantial portion of the intersection between the two {111} planes is obliterated. Since the {111} planes are provided in the three-dimensional structures to form a planar surfaces against which optical elements may be precisely positioned, absence of a substantial portion of the {111} planes at the intersection can introduce a great deal of variability in the positioning of the elements at the intersection. Thus, the benefits provided by the crystallographic planes can be unacceptably diminished.

Traditionally, to avoid etching intersecting features, dicing saw cuts may be used. However, dicing saw cuts can be undesirable, because such cuts typically must extend across the entire substrate, or consume an undesirably large portion of it, and may not conveniently be located at discrete locations within the substrate. Moreover, dicing saw cuts create debris which may be deposited across the substrate surface and lodge within the three-dimensional structures, which may interfere with the precise positioning of optical elements within such a structure.

Therefore, there remains a need in the art for optical microbench technology which permits three-dimensional structures having crystallographic planar surfaces to intersect with other surfaces, without degrading the crystallographic orientation of the intersected planar surfaces. Further, there remains a need in the art to combine crystallographic surfaces and vertical dry etched surfaces together in the same structure.

SUMMARY

The present invention provides a substrate having an etch-stop pit and an etched feature, such as an anisotropically etched feature, disposed adjacent the etch-stop pit. The anisotropically etched feature may comprise a V-groove. The etch-stop pit may have a shape suited to supporting an etch-stop layer on the surfaces of the etch-stop pit. The etch-stop pit may desirably be created prior to creating the etched feature. The etch-stop layer may comprise a material resistant to the etchant which is used to create the etched feature. After the etch-stop layer is provided, the anisotropically etched feature is etched in the substrate. The etch-stop layer prevents the feature etch from extending into the region where the etch-stop pit is located. The prevention of such etching by the etch-stop layer provides that the crystallographic planar walls of the anisotropically etched feature maintain their crystallographic orientation adjacent the stop-etch pit. For example, the present invention provides a micromachined crystalline substrate, comprising: an anisotropically etched groove disposed in a substrate surface; an anisotropically etched pit disposed in the substrate surface, the pit comprising a sidewall to provide a reflection surface for optical communication with the groove; and a directionally-etched etch-stop pit comprising a first sidewall portion that intersects the groove at a non-orthogonal angle relative to a longitudinal axis of the groove so that at least a portion of a wedge-shaped end portion of the groove is absent and comprising a second sidewall portion that intersects the pit so that at least a portion of a pit sidewall adjacent the etch-stop pit is absent.

The present invention also provides a method for micromachining a crystalline substrate, comprising: providing a crystalline substrate having a surface; directionally etching a first etch-stop pit in the substrate; coating the first etch-stop pit with a mask material; anisotropically wet etching an area adjacent to the first etch-stop pit to provide a groove disposed in the substrate surface; and anisotropically wet etching a first wet-etched pit after formation of the first etch-stop pit, the first wet-etched pit comprising a sidewall to provide a reflection surface for optical communication with the groove, wherein the first etch-stop pit is disposed between the groove and the first wet-etched pit. In addition, the present invention provides a micromachined crystalline substrate fabricated by the method recited in the preceding sentence.

In addition, the present invention provides method for micromachining a crystalline substrate, comprising: providing a crystalline substrate having a surface; directionally etching in the substrate two or more open ended, ring-shaped etch-stop pits with at least two of the etch-stop pits oriented so that their respective open ends are not in facing relation; coating the etch-stop pits with a mask material; and anisotropically wet etching an area surrounding the etch-stop pits to provide a wet-etched pit having a base disposed in the substrate and to provide a respective wedge-shaped protrusion interior to each etch-stop pit, the protrusions extending upward from the wet-etched base. Further the present invention provides a method for micromachining a crystalline substrate, comprising: providing a crystalline substrate having a surface; directionally etching an etch-stop pit in the substrate in the surface; coating the etch-stop pit with a mask material; and anisotropically wet etching an area surrounding the etch-stop pit to provide a wet-etched pit having a base disposed in the substrate and to provide two or more wedge-shaped protrusions adjacent the etch-stop pit, the protrusions extending upward from the wet-etched base.

BRIEF DESCRIPTION OF THE DRAWINGS

The foregoing summary and the following detailed description of the preferred embodiments of the present invention will be best understood when read in conjunction with the appended drawings, in which:

FIGS. 71A and 711B schematically illustrate a top view and a side cross-sectional view taken along the line A—A in FIG. 71A, respectively, of a substrate having a U-shaped etch-stop pit disposed within a wet-etched pit to provide a wedge-shaped protrusion in the wet-etched pit;

FIG. 72 schematically illustrates a top view, respectively, of a substrate having four U-shaped etch-stop pits disposed within a wet-etched pit to provide four wedge-shaped protrusions in the wet-etched pit FIGS. 73A and 73B schematically illustrate a top view and a side cross-sectional view taken along the line A—A in FIG. 73A, respectively, of a substrate having four generally triangular etch-stop pits disposed within a wet-etched pit to provide four wedge-shaped protrusions in the wet-etched pit;

FIG. 73C schematically illustrates the substrate of FIG. 73B but having an additional V-pit for holding a ball lens;

DETAILED DESCRIPTION OF THE INVENTION

Referring now to the figures, wherein like elements are numbered alike throughout, several different embodiments of devices in accordance with the present invention are illustrated. The different embodiments include a substrate having at least two common features, an etch-stop pit and an anisotropically etched feature adjacent the etch-stop pit. The etch-stop pit has a shape suited to supporting an etch-stop layer on the surfaces of the etch-stop pit. The etch-stop pit is created prior to creating the anisotropically etched feature. The etch-stop layer comprises a material resistant to the etchant which is used to create the anisotropically etched feature. After the etch-stop layer is provided, the anisotropically etched feature is etched in the substrate. The etch-stop layer prevents the anisotropic etching from extending into the region where the etch-stop pit is located. The prevention of such anisotropic etching by the etch-stop layer provides that the crystallographic planar walls of the anisotropically etched feature maintain their crystallographic orientation adjacent the stop-etch pit. The advantages of preventing such etching are illustrated in the accompanying figures depicting several desirable embodiments of the present invention.

Throughout the figures, the substrate material is selected to be <100>-oriented silicon. However, other orientations of silicon, such as <110>-oriented silicon, may also be used in accordance with the present invention. In addition, other anisotropic crystalline materials, such as III–V semiconductor materials, e.g., InP, GaAs, InAs, or GaP, may be used in accordance with the present invention. The substrate material is chosen with regard to the nature of the particular optical device and the features to be fabricated. The crystal orientation of the substrate may be chosen with respect to the desired orientation of the sidewalls of the fabricated features. For example, <100>-oriented silicon may be selected to create features having sidewalls that are sloped with respect to the upper surface of the substrate. Alternatively, <110>-oriented silicon may be selected to create features having sidewalls that are perpendicular to the upper surface of the substrate.

Figure 1:
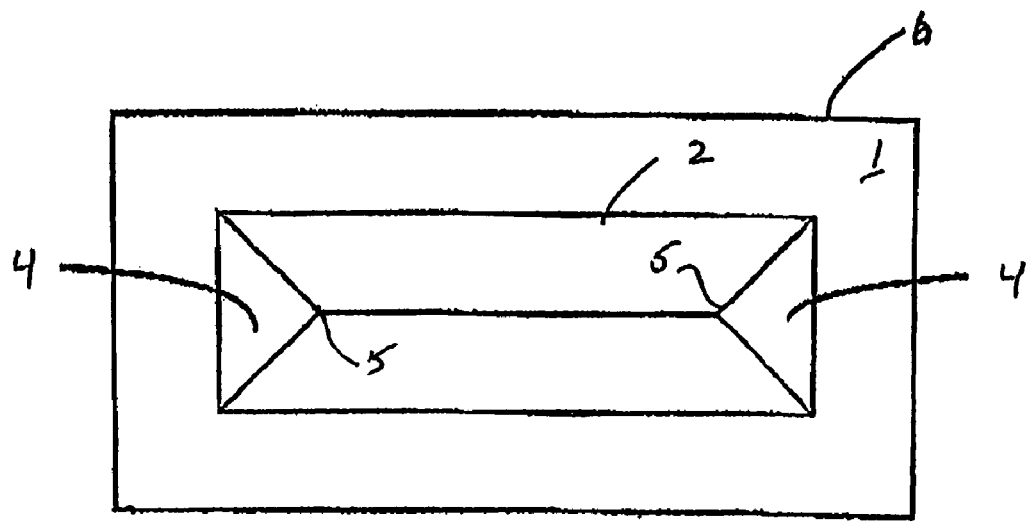
FIG. 1 schematically illustrates a top view of a V-groove provided in an upper surface of a substrate, where the V-groove includes two ends which include wedge-shaped end portions.

An example of a typical feature which may be formed by anisotropic etching in an <100>-oriented silicon substrate 6 is a V-groove 2, as illustrated in FIG. 1. In a first aspect of the present invention a modified V-groove 2 is provided, V-groove 12, having a configuration particularly well-suited to retaining a cylindrical element, such as an optical fiber or GRIN rod lens, as illustrated in FIGS. 2A–2D.

Turning first to the V-groove 2 illustrated in FIG. 1, each surface of the V-groove 2 is a {111}-plane of the silicon substrate 6. The V-groove 2 may be made by known methods such as etching through a rectangular aperture mask using an aqueous solution of KOH. A V-groove 2 which does not extend to the edges of the substrate 6 includes two wedge-shaped end walls 4. The end walls 4 slope upwardly towards the upper surface 1 of the substrate 6 from an apex 5. A wedge-shaped end wall 4 is often undesirable in optical subassemblies, because a wedge-shaped end wall 4 can partially or completely occlude the optical path to block light transmitted to or from an optical element disposed in the V-groove 2. In addition, the wedge-shaped end wall 4 functions poorly as an optical fiber stop, since the wedge-shaped end wall 4 is sloped with respect to the endface of the fiber which is usually perpendicular to the longitudinal axis of the fiber. Thus, it is desirable to create a V-groove without one or more of the wedge-shaped end walls 4.

Figure 2A:
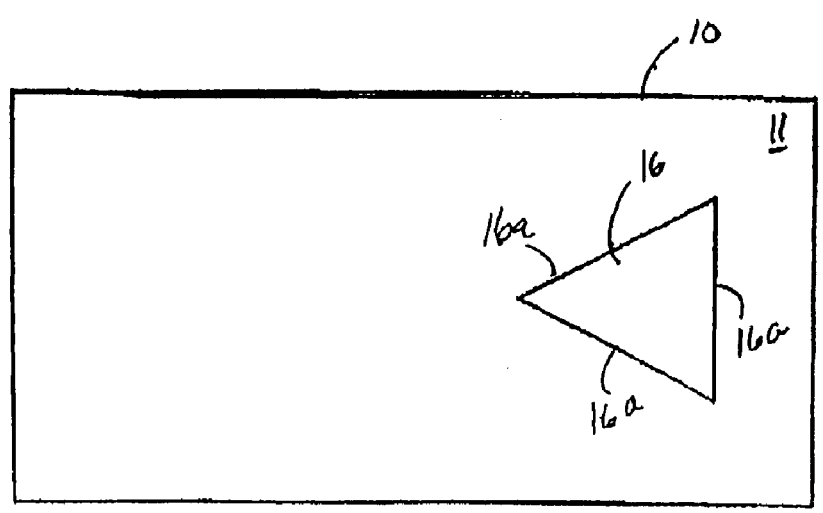
FIGS. 2A–2D schematically illustrate top views of a substrate showing the changes to the substrate as features are added to the substrate to create a structure having a V-groove and an adjoining etch-stop pit in accordance with a first embodiment of the present invention.
Figure 2B:
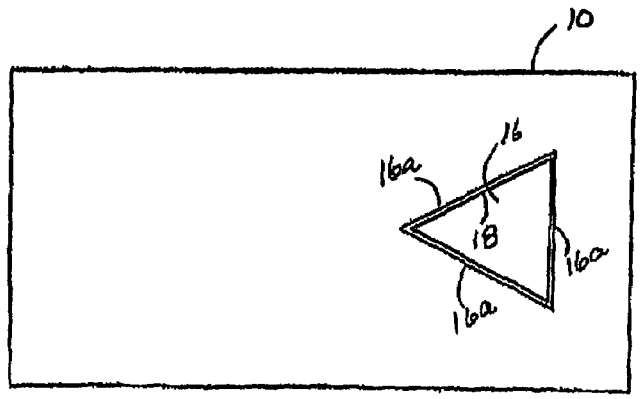
Figure 2C:
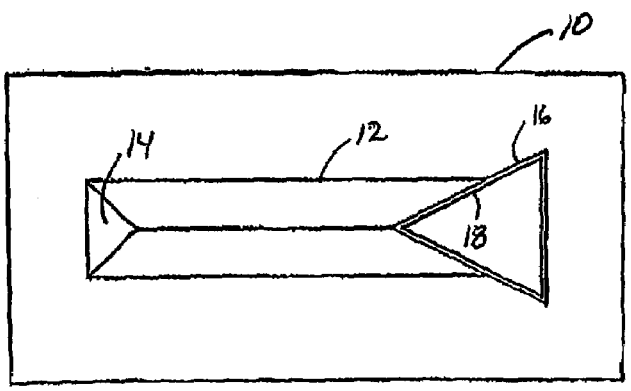
Figure 2D:
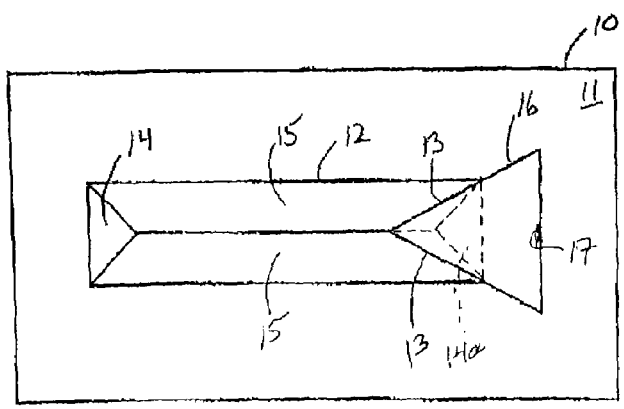

In particular, referring to FIG. 2D, a V-groove structure in accordance with the present invention is illustrated where one of the wedge-shaped end walls 14a, shown in phantom, is eliminated from the V-groove 12. The device includes a substrate 10 having an upper surface 11 in which a V-groove 12 and adjacent etch-stop pit 16 are provided. The edges 13 where the V-groove 12 and the stop-etch pit 16 intersect are straight line segments that lie within the {111}-plane of the V-groove sidewalls 15. The ability to remove the right end wall 14a while maintaining the {111}-orientation of the sidewalls 15 in the vicinity of the removed end wall 14a is provided by the etch-stop pit 16 and etch-stop layer 18.

The sequence in which the etch-stop pit 16 and V-groove 12 are formed in the surface of the substrate 10 is illustrated in FIGS. 2A–2D. Turning to FIG. 2A, a top elevational view of the substrate 10 is shown in which an etch-stop pit 16 is formed. As depicted, the etch-stop pit 16 has a triangular cross-section in the plane of the upper surface 11 of the substrate 10. Other shapes than triangular cross-section may be used so long as such shapes are suited to preventing the formation of a wedge-shaped end wall 14a of the V-groove 12. The types of shapes which may be used are discussed below with reference to FIGS. 3 and 4.

The walls of the etch-stop pit 16 may desirably extend into the substrate 10 at a 90 degree angle, i.e. vertical, relative to the upper surface 11 of the substrate 10, and the etch-stop pit 16 may contain a flat bottom parallel to the plane of the upper surface 11. Such a configuration of the etch-stop pit 16 may be fabricated by high-aspect ratio dry etching, such as reactive ion etching such as the BOSCH etching process. Alternatively, the etch-stop pit 16 may include sidewalls that are sloped with respect to the plane of the upper surface 11. Regardless of the sidewall slope that is utilized, the portions of the sidewalls 16a located proximate the region at which the V-groove 12 is to be formed, i.e. at intersecting segments 13, should extend into the substrate 10 a greater depth than the depth intended for the adjoining portion of the V-groove 12. Providing such a deeper sidewall portion ensures that a subsequently applied etch-stop layer 18 provides a barrier between an etchant in the V-groove 12 and the etch-stop pit 16.

After formation of the etch-stop pit 16, an etch-stop layer 18 is conformally provided on the sidewalls 16a and the bottom of the etch-stop pit 16. The etch-stop layer 18 comprises a material that is resistant to the etchant that will be used to create the V-groove 12. For example, the etch-stop layer 18 may comprise silicon dioxide, which may be provided by CVD or by thermally oxidizing surfaces 16a of the etch-stop pit 16, or silicon nitride, which may be provided by CVD. Optionally, the upper surface 11 of the substrate 10 may be provided with a layer of the same material used for the etch-stop layer 18.

The V-groove 12 is formed in the surface 11 of the substrate 10 by a suitable process, such as anisotropic wet etching with KOH or EDP through a rectangular aperture mask. The rectangular aperture mask is oriented such that the perimeter of the rectangular aperture is registered to the perimeter of the V-groove 12 located in the upper surface 11 of the substrate 10. The rectangular aperture mask is oriented such that a portion of an end of the rectangular aperture overlies the etch-stop pit 16. Further details regarding how the masks are provided is discussed below in connection with the method of the present invention.

As an optional additional step, the etch-stop layer 18 may be removed from the etch-stop pit 16. Removal of the etch-stop layer allows the V-groove 12 to communicate with the etch-stop pit 16. Such communication permits an element, such as a fiber, disposed within the V-groove 12 to extend into the region over the etch-stop pit 16 and abut the sidewall 16a of the etch-stop pit 16 that is disposed perpendicular to the longitudinal axis of the V-groove 12, to provide a fiber stop 17.

The process described above with respect to FIG. 2D is suited to forming all of the structures illustrated herein. For example, each of the following structures described below includes at least one etch-stop pit which is formed before an adjacent anisotropically etched feature, such as a V-groove is formed adjacent to the pit. In addition, an etch-stop layer is provided in the etch-stop pit prior to forming a anisotropically etched feature. While the etch-stop layer may not be illustrated in the figures, because it has been removed after the formation of the anisotropically etched feature, it is understood that the etch-stop layer is present within the etch-stop pit while the anisotropically etched feature is being formed.

In addition to the triangular cross-sectional shape of the etch-stop pit 16 illustrated in FIGS. 2A–2D, other cross-sectional shapes may be used in accordance with the method of the present invention to completely or partially prevent the formation of a wedge-shaped end wall of a V-groove, as shown in FIGS. 3C–3F and 4A–4D. For example, a first type of etch-stop pit configuration for completely preventing the formation of a wedge-shaped end wall 44 is illustrated in FIGS. 4A–4D. FIGS. 4A–4D illustrate top elevational views of a V-groove 42 adjacent to etch-stop pits 46, 47, 48, 49 of differing cross-sectional areas. In each configuration, the etch-stop pit 46, 47, 48, 49 completely overlays a region of the substrate in which the wedge-shaped end wall 44 of the V-groove 42 would otherwise be formed. The etch-stop pit 46, 47, 48, 49 and V-groove 42 may be formed in the substrate by the procedure described above with respect to the device illustrated in FIG. 2D.

One desirable configuration of an etch-stop pit 49 comprises two sidewalls joined at an apex that lies along the longitudinal axis of the V-groove 42 such that the apex angle, a, is bisected by the longitudinal axis. Such a configuration of an etch-stop pit 49 can prevent the formation of a wedge-shaped end wall 44 when the apex angle is less than or equal to 90 degrees.

Figures 3A, 3B:
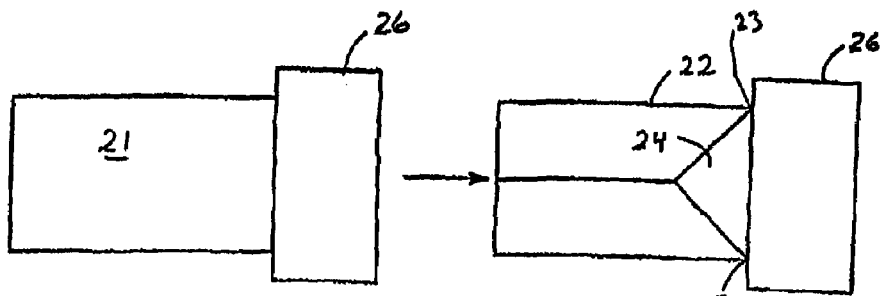
FIGS. 3A–3F and 4A–4D schematically illustrate top views of alternative etch-stop pit configurations with the adjoining V-grooves in accordance with the present invention.
Figures 3C, 3D:
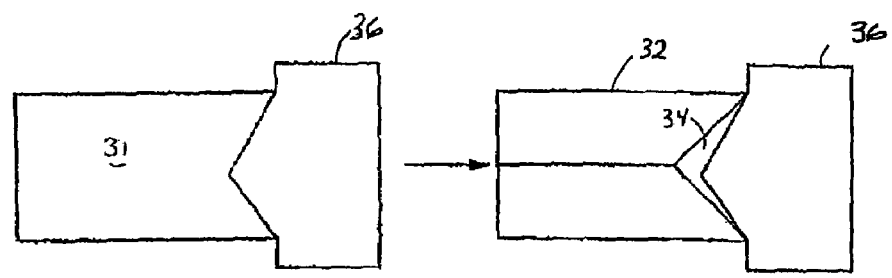
Figures 3E, 3F:
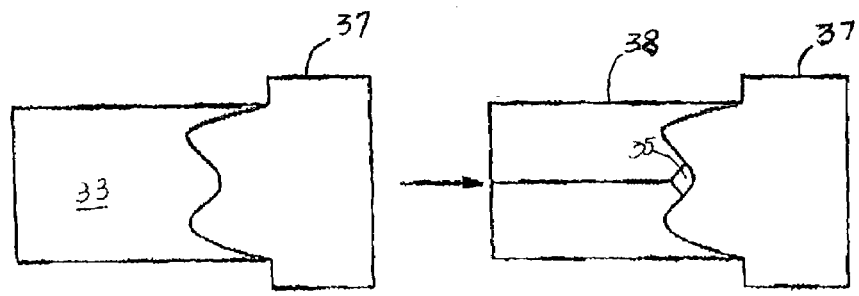
Figure 4A:
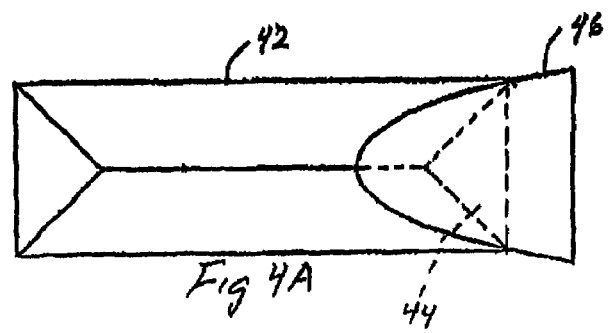
Figure 4B:
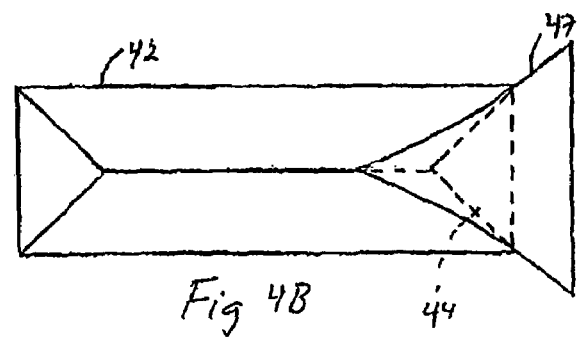
Figure 4C:
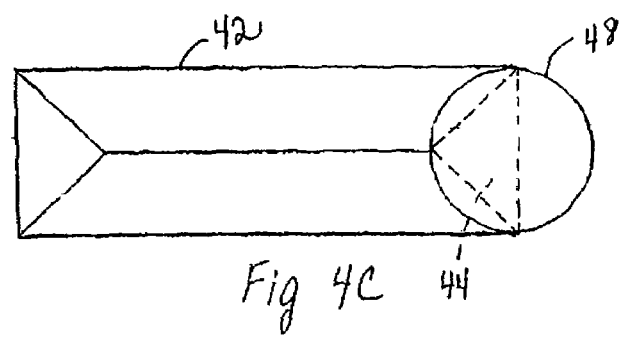
Figure 4D:
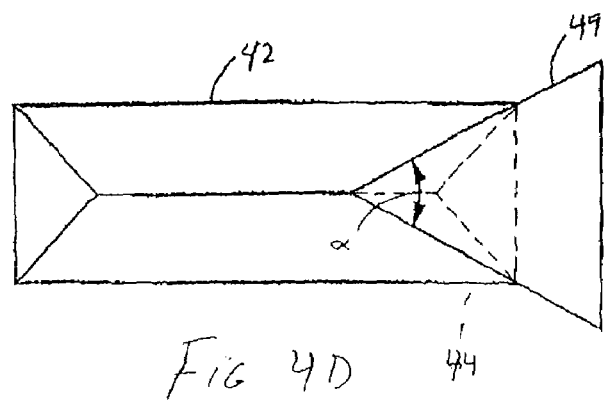

If the apex angle were greater than 90 degrees, as illustrated in FIGS. 3C and 3D, a partial wedge-shaped end wall 34 would be formed in the V-groove 32. In the configuration where the "apex angle" is equal to 180 degrees, i.e. a straight line, the typical wedge-shaped end wall 24 would be formed in the V-groove 22, as illustrated in FIGS. 3A and 3B. That is, an etch-stop pit 26 having a straight sidewall 23 adjacent to the area in which the V-groove 22, is to be formed, and oriented perpendicular to the longitudinal axis of the V-groove 22, allows for the formation of a wedge-shaped end wall 24. Other cross-sectional shapes of an etch-stop pit are contemplated in accordance with the present invention, such as the "W" cross-sectional shape depicted in FIGS. 3E and 3F.

Figure 38A:
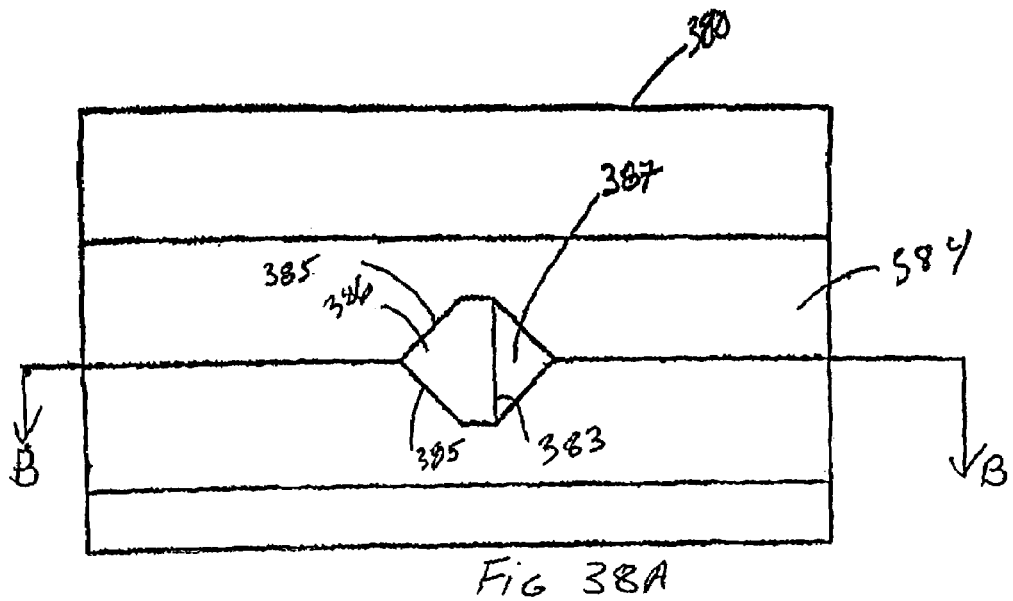
FIGS. 38A and 39A schematically illustrate top views of substrates having a V-groove with an etch-stop pit and fiber stop disposed internally to the groove.
Figure 38B:
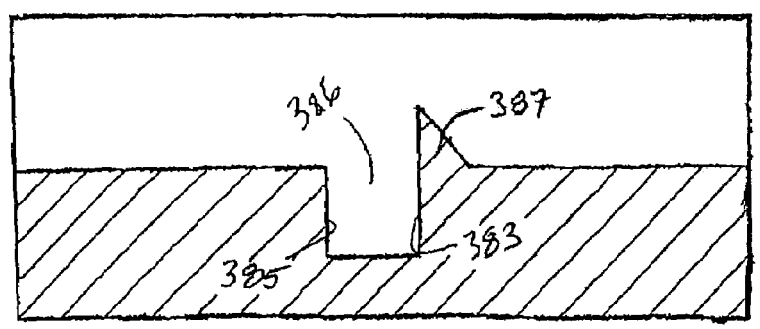
FIGS. 38B and 39B schematically illustrate cross-sectional views of the substrates illustrated in FIGS. 38A and 39A, respectively.
Figure 39A:
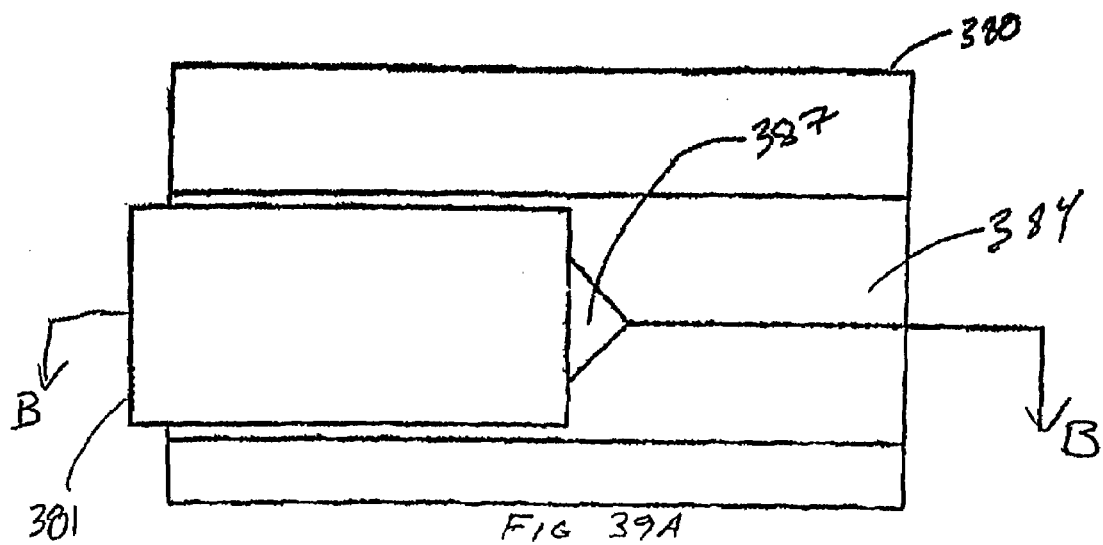
Figure 39B:
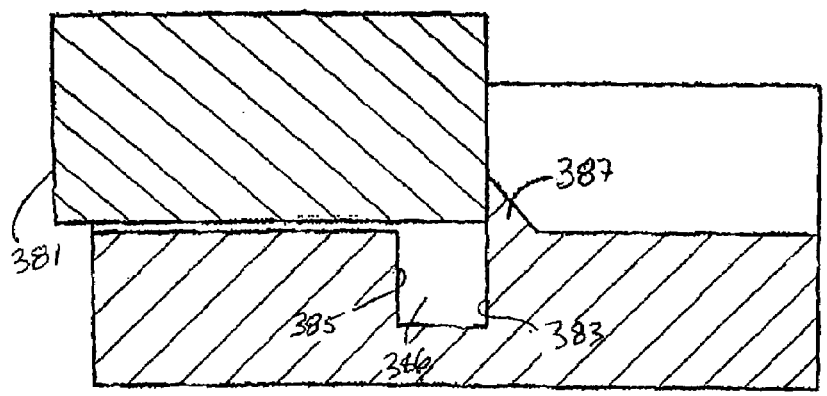

Yet another configuration of an etch-stop pit 386 in accordance with the present invention may be provided so that a fiber stop 387 is created within a V-groove 384, as illustrated in FIGS. 38A–38B and 39A–39B. FIGS. 38A and 39A illustrated top views of a substrate 380 in which a V-groove 384 is formed. FIGS. 38B and 39B illustrate cross-sectional views taken along the lines B—B in FIGS. 38A and 39A, respectively. The etch-stop pit 386 has a shape that promotes the formation of a wedge-shaped fiber stop 387 along a {111} crystallographic plane adjacent a first sidewall 383 of the etch-stop pit 386. In particular, the straight sidewall 383 oriented perpendicular to the longitudinal axis of the V-groove 384 promotes the formation of the wedge-shaped fiber stop 387 in an analogous fashion to the formation of the wedge-shaped end wall 24 in FIG. 3B. The etch-stop pit 386 also comprises a pair of angled sidewalls 385 across the dark and 386 from the first end wall 383. The angled sidewalls 385 intersect at a selected apex angle which has a magnitude and orientation suitable for preventing the formation of wedge-shaped surfaces, i.e. {111} surfaces, in the V-groove 384 adjacent to the angled sidewalls 385. The angled sidewalls 385 may have a similar configuration to corresponding sidewalls depicted in FIG. 2D. As illustrated in the cross-sectional views of FIGS. 38B and 39B, the wedge-shaped fiber stop 387 extends above the deepest portion of the V-groove 384 so that a fiber 381 disposed within the V-groove 384 may abut the wedge-shaped fiber stop 387.

Figure 5:
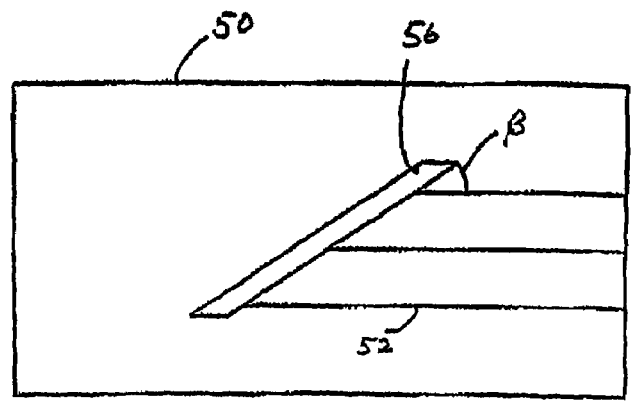
FIG. 5 schematically illustrates a top view of an alternative etch-stop pit configuration in accordance with the present invention for preventing formation of a wedge-shaped end wall in a V-groove.
Figure 6:
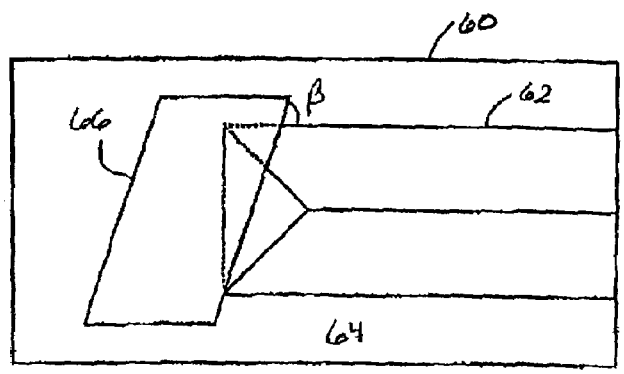
FIG. 6 schematically illustrates a top view of an alternative etch-stop pit configuration in accordance with the present invention for providing a partial, wedge-shaped end wall in a V-groove.
Figure 7:
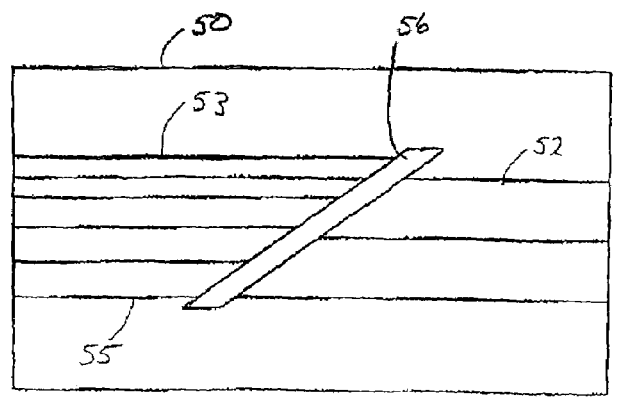
FIG. 7 schematically illustrates a top view of an alternative etch-stop pit configuration in accordance with the present invention for preventing formation of a wedge-shaped end walls in three V-grooves which adjoin the etch-stop pit.

A second type of etch-stop pit configuration that prevents a wedge-shaped end wall from forming has a parallelogram cross-sectional shape oriented at an angle, β, of 45 degrees or less, with the longitudinal axis of the V-groove 52, as illustrated in FIG. 5. If, the angle, β, is larger than 45 degrees, as depicted in the configuration of FIG. 6, then a partial wedge-shaped end wall 64 is formed in the V-groove 62. In a case where β is 90 degrees, the configuration of the etch-stop pit becomes functionally equivalent to that of the etch-stop pit depicted in FIG. 3A. In addition, V-grooves 52, 53, 55 may be provided on opposing sides of the etch-stop pit 56 as illustrated in FIG. 7. So long as the longitudinal axis of each V-grooves 52, 53, 55 is oriented at an angle less than 45 degrees relative to an adjacent surface of the etch-stop pit 56, the etching process in accordance with the present invention will not produce wedge-shaped end walls in the V-grooves 52, 53, 55 in the region adjacent the etch-stop pit 56. Any number of V-grooves may be so provided, and such grooves need not have the same size.

Returning now to the configuration illustrated in FIG. 2D, where the combined V-groove 14 and etch-stop pit 16 provide a cavity having a fiber stop 17 for retaining a fiber optic, further optical subassemblies may be fabricated by providing additional features in or on the substrate 10. Such subassemblies may provide for optical communication with the fiber. In particular, the structure of FIG. 2D is well-suited for use with other optical elements, because the fiber stop 17 provides a fiducial reference point to precisely identify where the end of the fiber is located.

Figure 8:
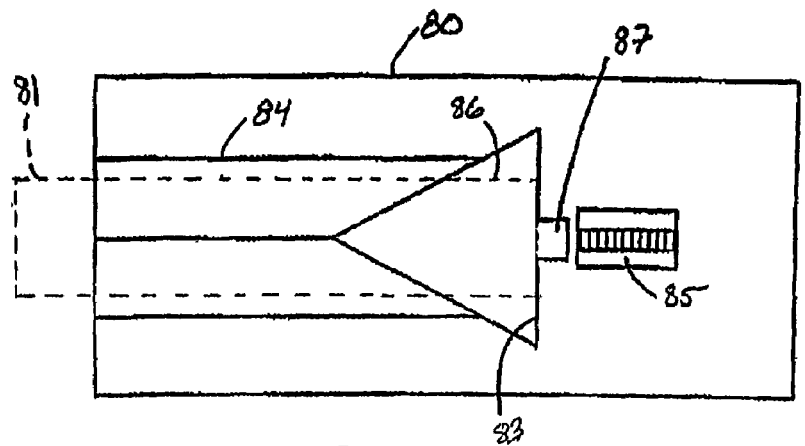
FIGS. 8–10 schematically illustrate top views of further configurations of etch-stop pits and V-grooves along with a device mount for providing optical subassemblies in accordance with the present invention.
Figure 9:
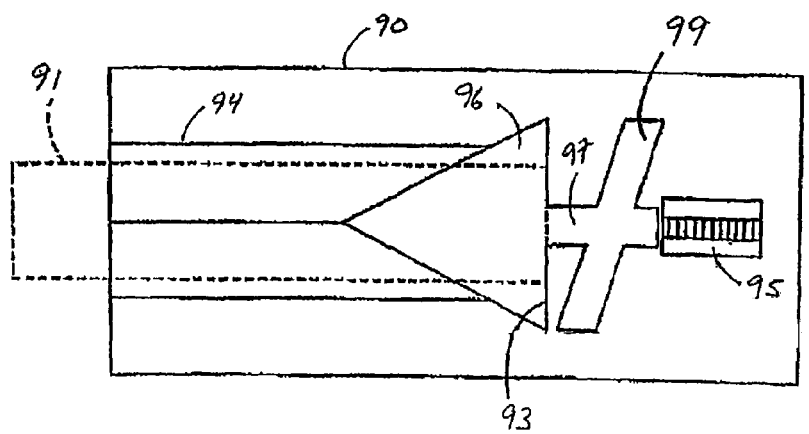
Figure 10:
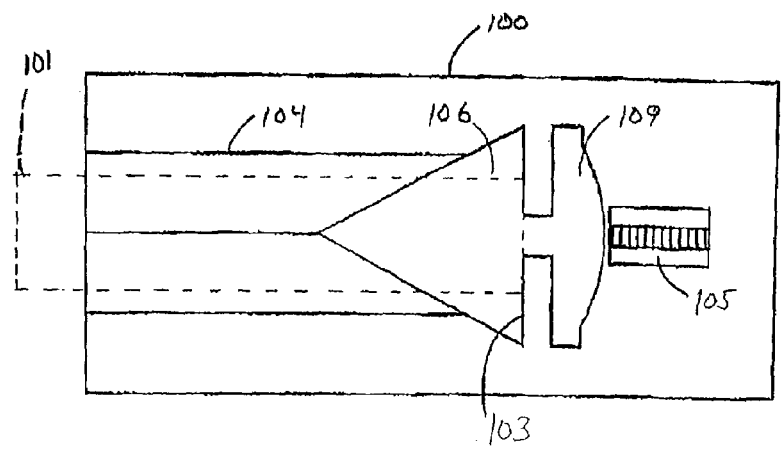

For example, FIGS. 8–10 illustrate top elevational views of additional configurations in accordance with the present invention that provide optical subassemblies comprising a fiber 81, 91, 101, a V-groove 84, 94 104, and a laser mount 85, 95, 105. Alternatively, detector or VCSEL mounts could be provided in place of the edge emitting laser mounts 85, 95, 105. In particular, with reference to FIG. 8, a V-groove 84 and adjoining etch-stop pit 86 with fiber stop 83 are provided in a configuration similar to that depicted in FIG. 2D described above. Advantages of the design in FIG. 8 include allowing a fiber, lensed tipped fiber, or cylindrical lens to be placed arbitrarily close to the edge emitting facet of the laser without interference from the otherwise adjoining <111> facet and without requiring a dicing cut to remove the facet. The etch-stop pit 86, however, is not precisely triangular in cross-section, but rather includes an etched area 87 that protrudes, in cross-section, from the fiber-stop edge of the etch-stop pit 86, so that the cross-sectional shape of the etch-stop pit 86 is similar to that of an arrowhead. The optional etched area 87 allows for beam expansion. In addition, a laser mount 85 is provided proximate the etched area 87 and is disposed along the longitudinal axis of the V-groove 84. It may be desirable to provide an optical device between the end of the fiber optic 81 and the laser mount 85. Accordingly, the configurations illustrated in FIGS. 9 and 10 provide slots 99, 109 for receiving optical elements. The slots 99, 109 communicate with the respective etch-stop pits 96, 106 and may be formed at the same time as the etch-stop pits 96, 106. The slots 99, 109 comprise vertical sidewalls, however, sloped sidewalls may also be provided. The slot 109 of FIG. 10 conveniently has a cross-sectional shape of a plano-convex lens, whereas the slots 99 is well-suited to receiving flat optics or lenses other than ball lenses.

Figure 11:
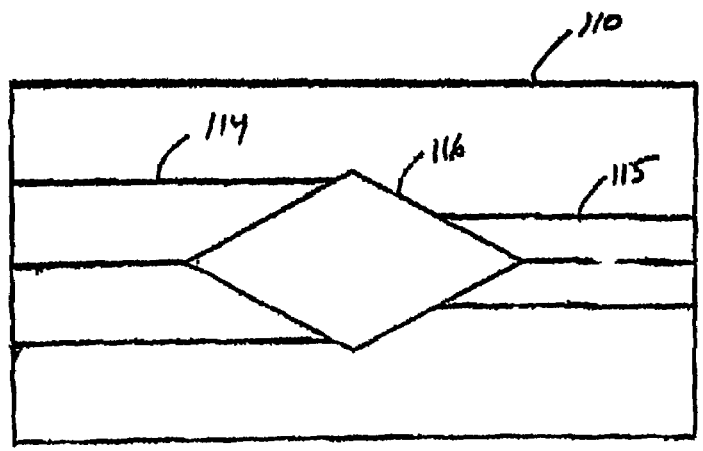
FIGS. 11–16 schematically illustrate top views of alternative configurations etch-stop pits with two or more V-grooves adjoining the etch-stop pits.
Figure 16:
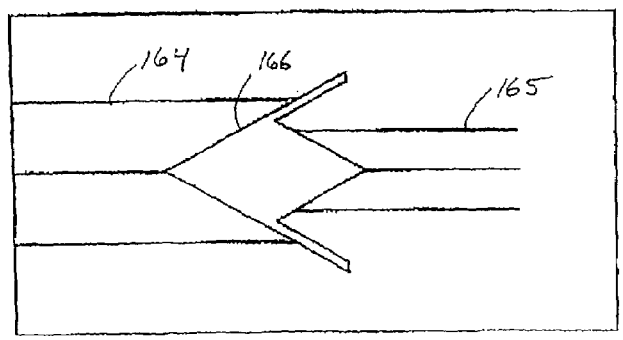

In yet another etch-stop pit configuration in accordance with the present invention, the etch-stop pit may have a diamond-like cross-sectional shape which is suited to device configurations that include two or more V-grooves disposed on opposing sides of the etch-stop pit, as illustrated in FIGS. 11–16. Referring to FIG. 11, a substrate 110 is shown which includes a diamond cross-sectional shaped etch-stop pit 116 with two V-grooves 114, 115 disposed on opposing sides of the etch-stop pit 116. The V-grooves 114, 115 have longitudinal axes are collinear and intercept at a respective vertex of the etch-stop pit 116. The region of intersection between each V-groove 114, 115 with the respective portion of the etch-stop pit 116, has a similar geometry to the intersection between the V-groove 14 and etch-stop pit 16 depicted in FIG. 2D. Thus, for the same reasons given above, no wedge-shaped end wall is formed in the V-grooves 114, 115 at the locations adjacent the etch-stop pit 116. To allow the end faces of respective fibers disposed in two V-grooves 164, 165 to be space more closely together, the etch-stop pit 166 may comprise a diamond-like shape that is compressed, as illustrated in FIG. 16.

Figure 12:
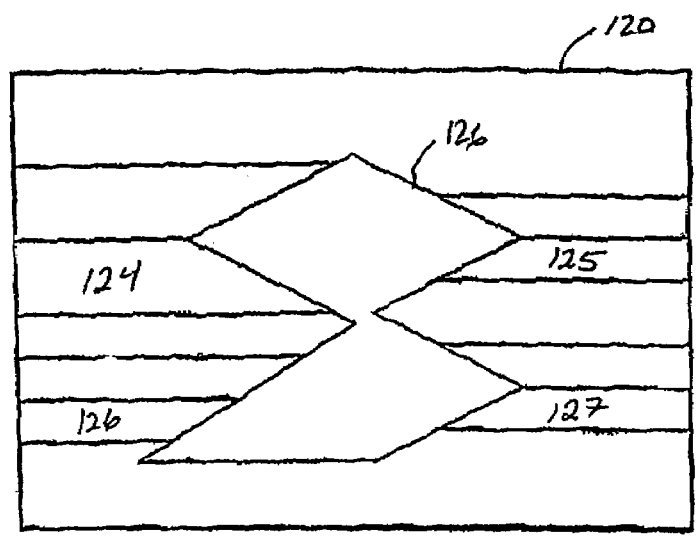
Figure 13:
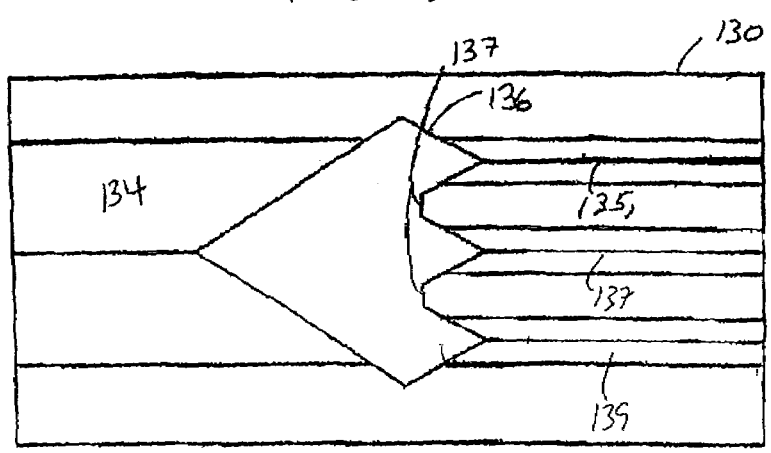

In a similar manner, the etch-stop pit 136 may have a cross-sectional shape suited to having a single V-groove 134 on one side of the etch-stop pit 136 and having two or more V-grooves 135, 137, 139, disposed at an opposing side of the etch-stop pit 136. In addition, the etch-stop pit 136 may have a cross-sectional shape suited to preventing the formation of a wedge-shaped end wall in each V-groove 134, 135, 137, 139 at the respective positions where the V-grooves 134, 135, 137, 139 adjoin the etch-stop pit 136. A suitable shape for such an etch-stop pit 136 is depicted in FIG. 13. The etch-stop pit 136 provides two fiber stops 137 for a fiber disposed in the V-groove 134. Yet additional shapes of an etch-stop pit 126 may be provided for preventing the formation of wedge-shaped end walls in multiple V-grooves 124, 125, 126, 127, as illustrated in FIG. 12. Wedge-shaped end walls do not form for the reasons given above with regard to FIGS. 4D and 7, for example.

In silicon optical bench, applications for such structures include aligning several fibers to a single grin lens or larger multi-mode fiber. Alternatively, in microfluidics, structures such as these can be use for fluidic mixing of multiple flow channels.

Figure 14:
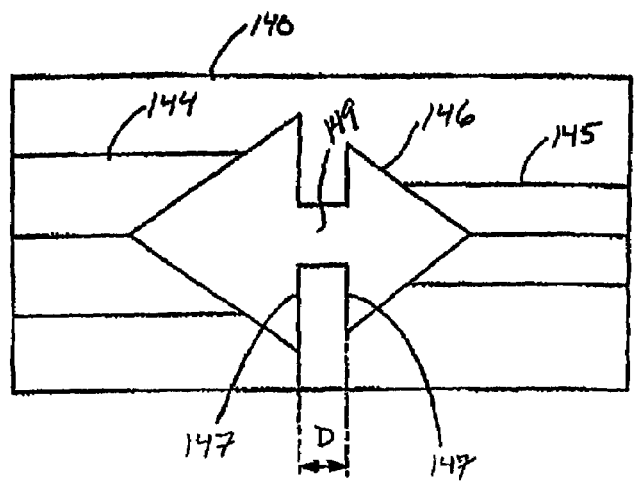
Figure 15:
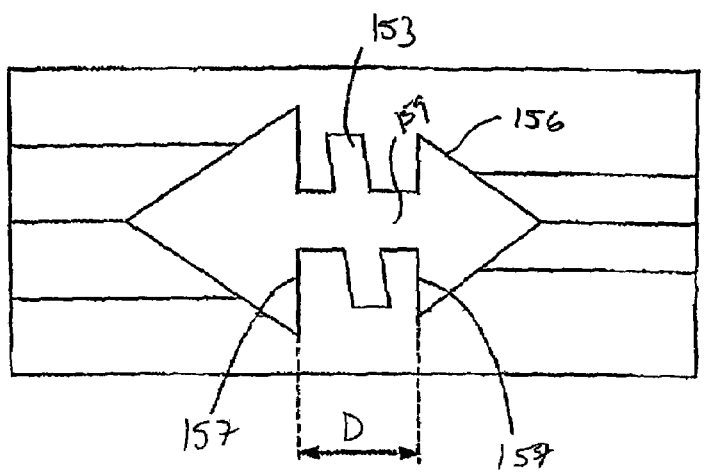

Still further, two of the 'etch-stop pit with adjoining V-groove'-structures illustrated in FIG. 2D may be provided in a single substrate 140 in back-to-back coaxial relationship with a passageway 149 extending between the two triangular sections of the etch-stop pit 146, as illustrated in FIG. 14. Such a configuration provides a fiber stop 147 for each of the V-grooves 144, 145 so that the distance, D, between the ends of two fibers, or cylindrical objects, located within the V-grooves 144,145 may be precisely specified. In addition, the passageway 159 may be sufficiently long so as to provide for insertion of an optical element between the two mechanical stops 157. A slot 153, or other suitable shape, may be provided to receive, for example, an optical element such as filter, isolator, etc.

Figure 17:
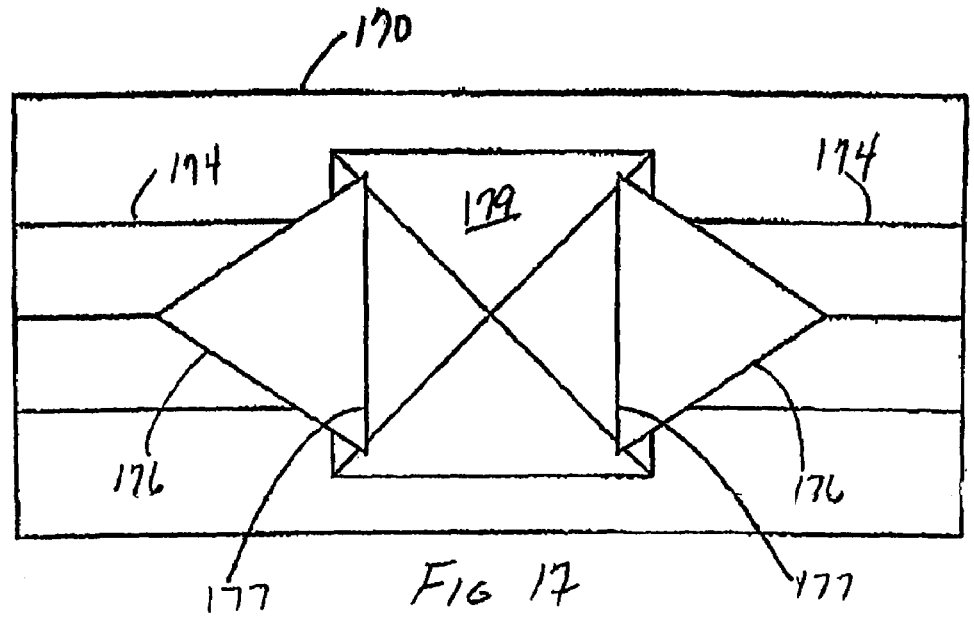
FIGS. 17–20 schematically illustrate top views of substrates having etch-stop pits, V-grooves, and an optional V-pit, for providing optical subassemblies in accordance with the present invention.
Figure 18:
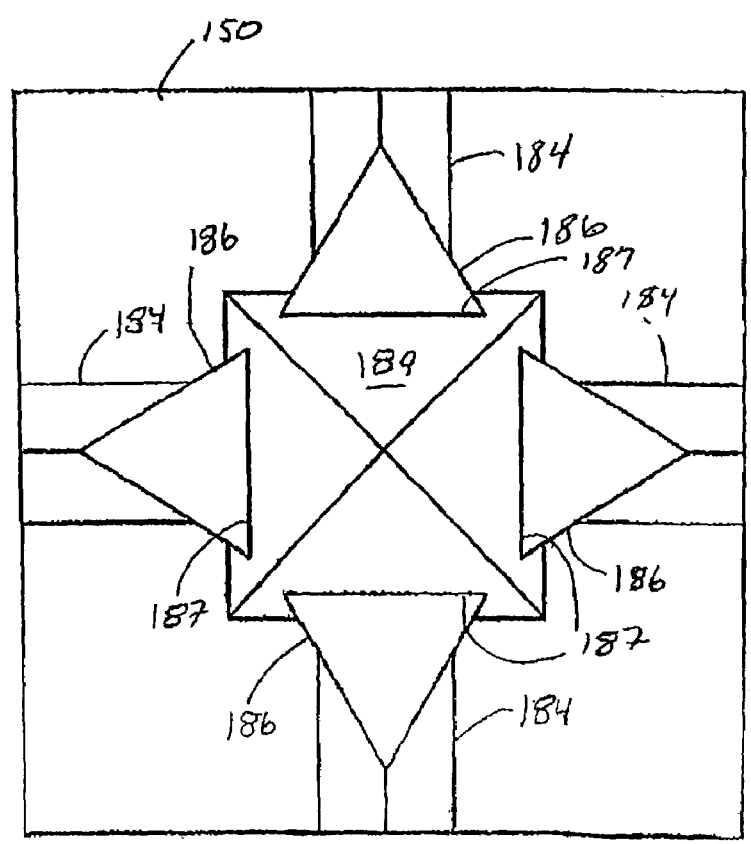
Figure 19:
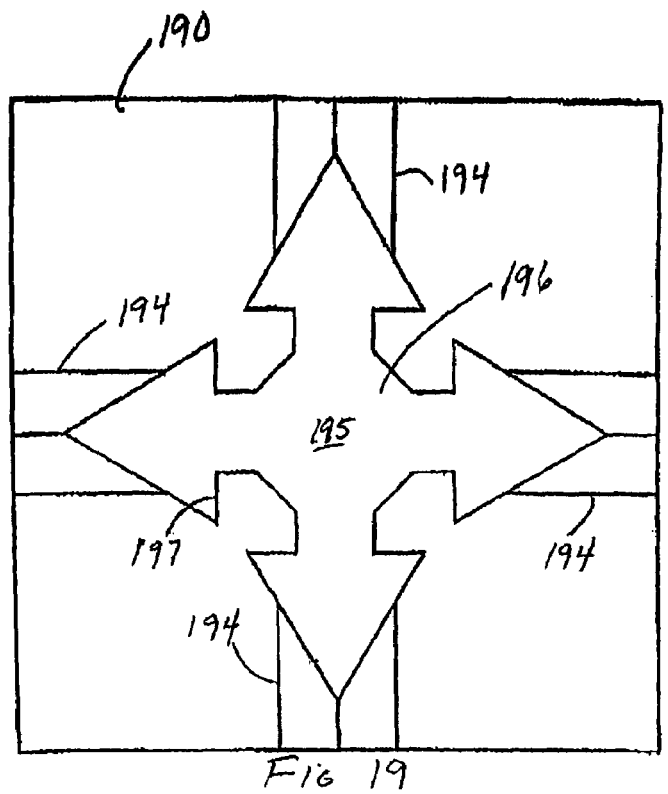
Figure 20:
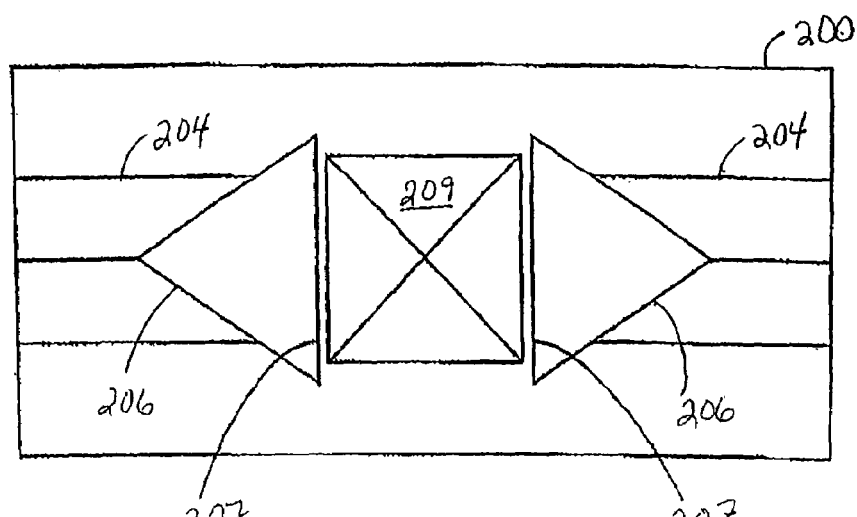
Figure 21:
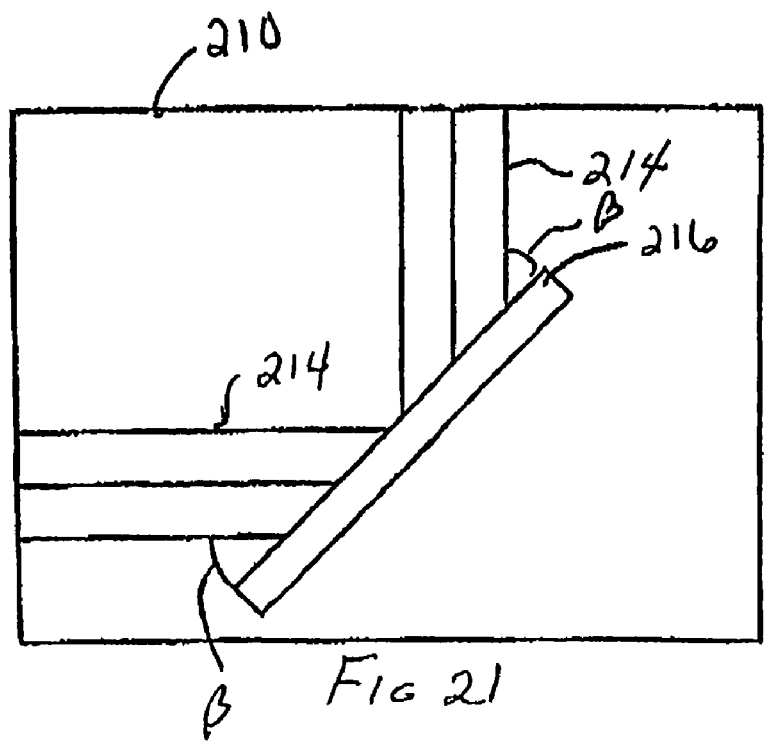
FIGS. 21–26 schematically illustrate top views of substrates having two V-grooves oriented at 90 degrees with respect to one another and having an etch-stop pit disposed at the location of the intersection of the two V-grooves.

In yet another aspect of the present invention, two or more the above-described 'etch-stop pit with adjoining V-groove' structures may be provided in a substrate with a V-pit disposed therebetween, as shown in FIGS. 17, 18, and 20. A V-pit 179, 189, 209 may be formed by anisotropic etching by the same methods used to form V-grooves but using a square aperture mask rather than a rectangular aperture mask. The V-pit 179, 189, 209 may be anisotropically etched at the same time as the grooves 174, 184, 204. The V-pit 179, 189, 209 should be etched after the etch-stop pit 176, 186, 206 and the etch-stop layer are provided, in accordance with the process described above in reference to FIG. 2D. The V-pit 179, 189, 209 comprises for triangular-shaped, sidewalls that lie in the {111} crystallographic planes to form a four-sided regular pyramid that extends into the substrate 170, 180, 200. Like the V-grooves 174,184 the V-pits 179,189 should extend into the substrate a depth less than the depth of the etch-stop pits 176, 186 at the point of intersection between the V-pits 179, 189 and the etch-stop pits 176, 186, as illustrated in FIGS. 17 and 18. In a configuration where the V-pit 209 does not intercept the etch-stop pit 206, the V-pit 209 depth does not need to be selected with regard to the depth of the etch-stop pit 206. The V-pits 179, 189, 209 provide a convenient shape for retaining a spherical optical element, such as a ball lens. The V-grooves 174, 184, 204 are positioned so that an optical element disposed within the V-grooves 174, 184, 204 can optically communicate with the optical element disposed within the respective V-pit 176, 186, 206. In alternative configuration, as illustrated in FIG. 19, the etch-stop pit 196 may contain a central portion 195 configured to hold a spherical optical element. For example, the central portion may have a diamond-like shape. The central portion 195 of the etch-stop pit 196 may serve the same function of retaining a spherical optical element as that of the V-pit 189, or may be configured to contain other elements such as beam splitting cubes, filters, circulators, and so on.

In another aspect of the present invention, an etch-stop pit may be provided at a location where two anisotropically etched features would intersect to form an inside, convex corner. A convex corner formed by the intersection of two {111} planes in the mask opening does not etch to form a straight line intersection between two planes, but rather creates a rounded or complexly eroded intersection between the two intersecting {111} planes. The rounding can propagate to remove material in the vicinity of the intersection, such that the well-defined {111} planes can be etched away in the vicinity of the intersection to yield structures that are not {111} planes. Thus, it would be desirable to prevent the formation of such rounded corners.

FIGS. 21–28 illustrate several configurations of etch-stop pits in accordance with the present invention which are suited to prevent undesirable etching at an inside, convex corner. Each of the structures in FIGS. 21–28 may desirably be formed by the process described above with reference to FIG. 2D, with an etch-stop pit and etch-stop layer provided in the substrate prior to anisotropically etching the V-grooves. For example, referring to FIG. 21, a top elevational view of the substrate 210 is shown in which two V-grooves 214 are disposed. The two V-grooves 214 are oriented with their respective longitudinal axes at 90 degrees relative to one another. An etch-stop pit 216 is provided at a selected location of the substrate 210 corresponding to the location at which the two V-grooves 214 would otherwise intersect. Providing the etch-stop pit 216 at the selected location prevents intersection of the V-grooves 214. The etch-stop pit 216 may be disposed at a 45 degree angle, β, so that wedge-shaped end walls are not formed in the V-grooves 214 adjacent the etch-stop 216. To provide for greater ease of alignment (lower alignment tolerances) between the etch-stop pit 216 and the longitudinal axis of the V-grooves 214, an angle of less than 45 degrees may be preferable.

Figure 22:
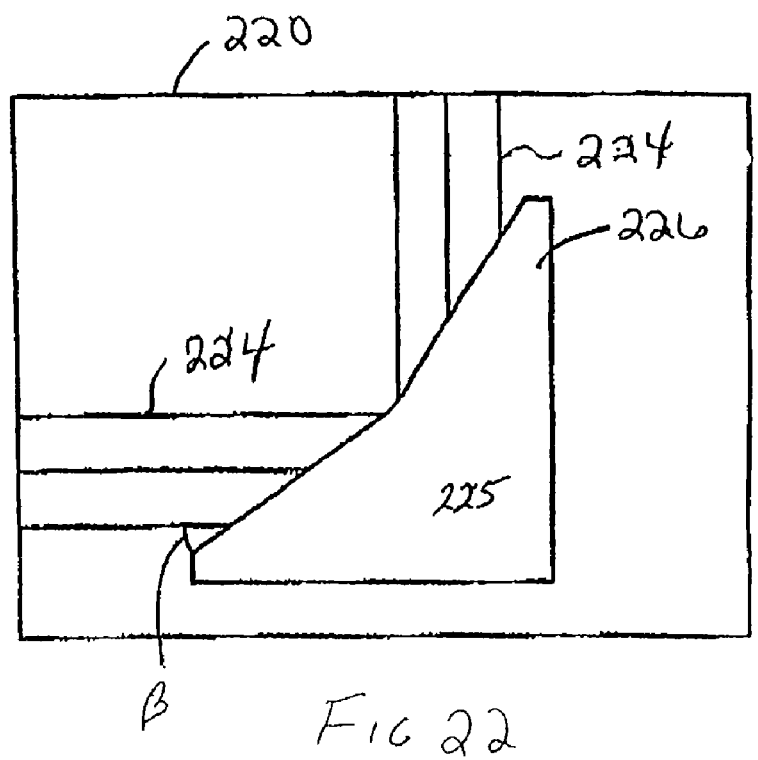
Figure 23:
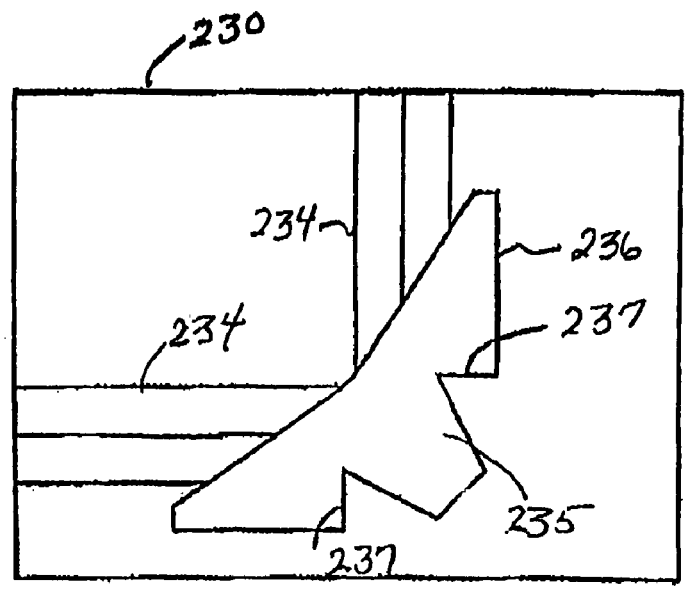
Figure 24:
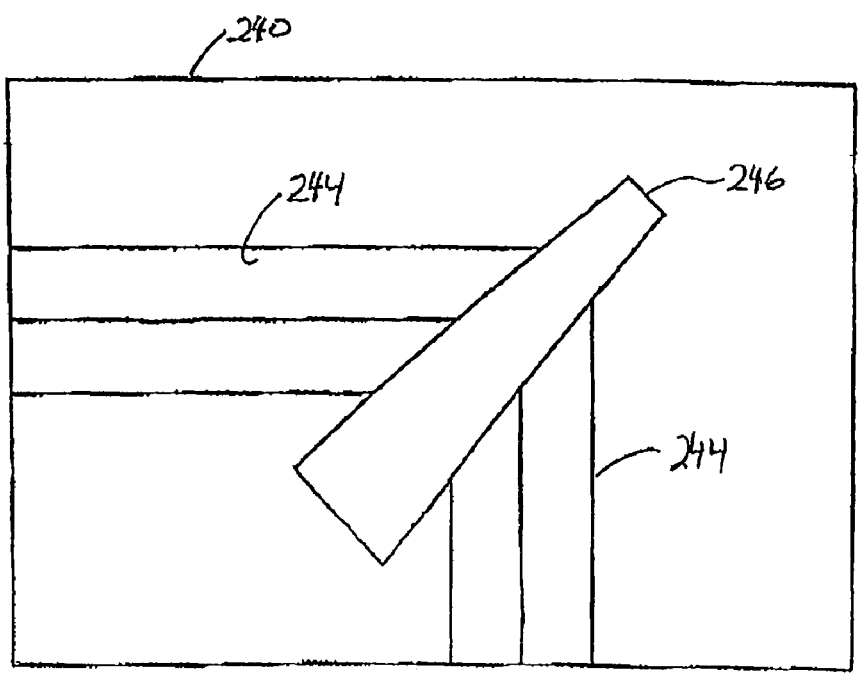
Figure 25:
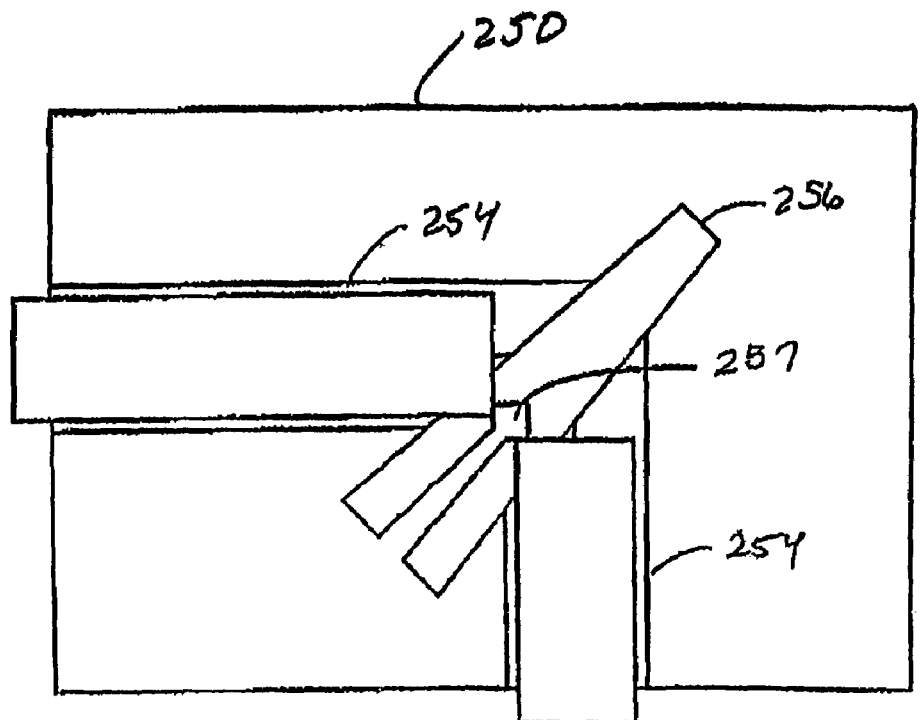
Figure 26:
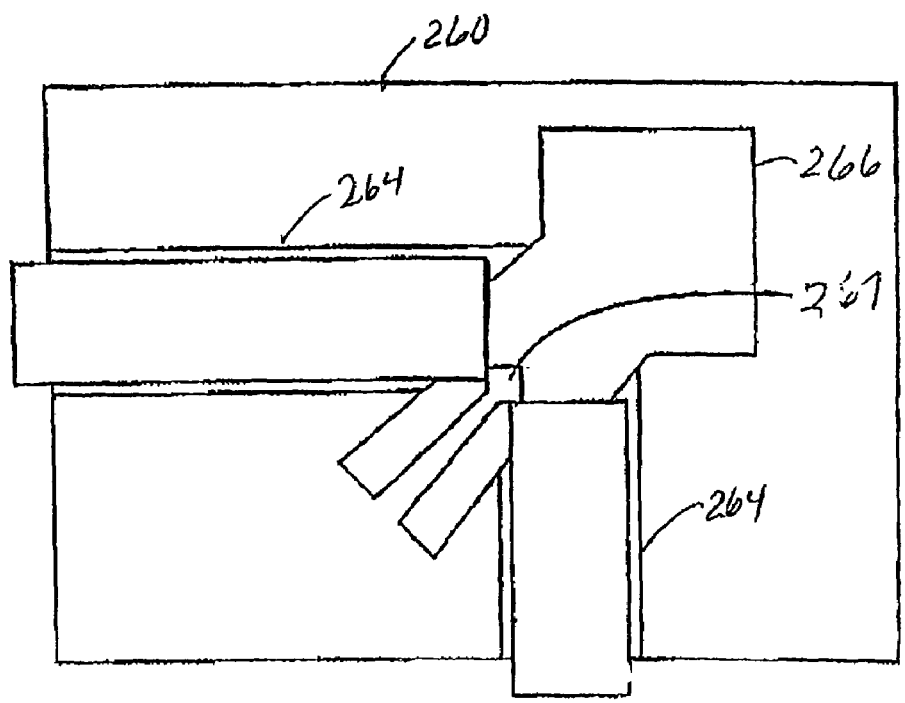

Alternative configurations of an etch-stop pit that prevent etching of an inside, convex corner and wedge-shaped V-groove end walls are illustrated in FIGS. 22–28. Each configuration depicted in FIGS. 22–28 includes V-grooves 224, 234, 244, 254, 264 oriented at 90 degrees with an intermediate etch-stop pit 226, 236, 246, 256, 266 in a similar configuration to that of FIG. 21. The etch-stop pit 226, 236, 246, 256, 266 is located to prevent intersection of the V-grooves 224, 234, 244, 254, 264. Each of the etch-stop pits 226, 236, 246, 256, 266 has straight wall segments disposed at an angle of 45 degrees or less with respect to the longitudinal axis of an adjacent V-groove 224, 234, 244, 254, 264. Referring to FIGS. 22 and 23, the etch-stop pit 226, 236 may include an interior portion 225, 235 for retaining optical element such as filters, lenses, micromechanical switches, for example. Such elements may be formed directly in the wafer, placed and bonded into the wafer, or may be formed on another wafer and recess into the cavity when two wafers are aligned and brought together. In addition, as illustrated in FIGS. 25 and 26, the etch-stop pit 256, 266 may have a shape configured to provide a fiber stop 257, 267 for fibers 251, 261 disposed within the V-grooves 254, 264.

Figure 27:
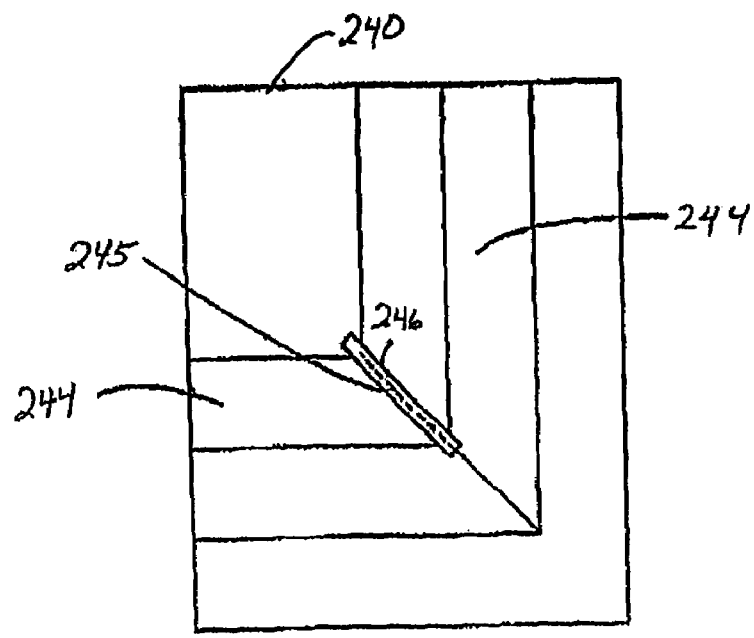
FIGS. 27 and 28 schematically illustrate top views of substrates having an etch-stop pits disposed at locations where an inside, convex corner of two intersecting V-grooves would be located.
Figure 28:
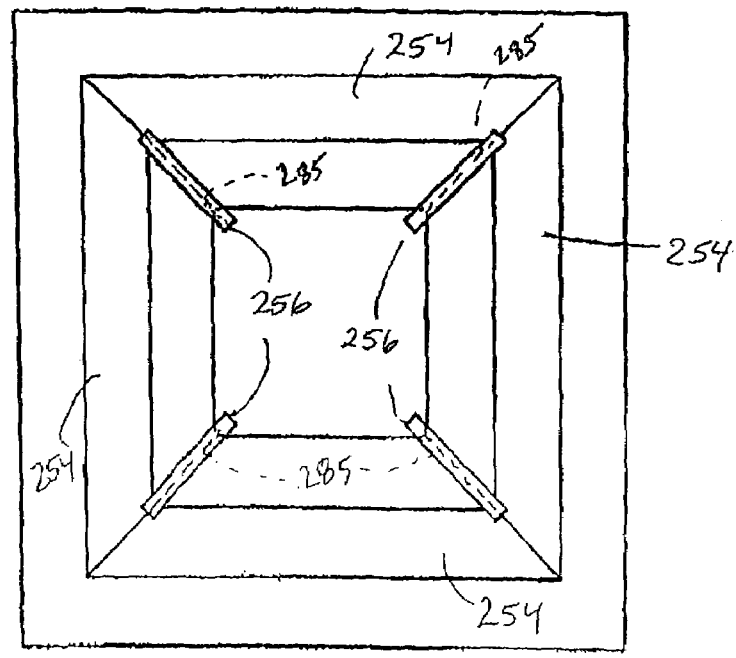

In accordance with the present invention, yet additional configurations of etch-stop pits 276, 286 are provided which permit the intersection of two V-grooves 274, 284 while preventing the formation of an inside, convex corner 275, 285, thus obviating the need for corner compensation, as illustrated in FIGS. 27 and 28. For example, a top elevational view of a substrate 270, 280 is shown in which pairs of V-grooves 274, 284 are provided in an upper surface of the substrate 270, 280. Pairs of V-grooves 274, 284 intersect at ends of the V-grooves 274, 284 at an angle of 90 degrees. An etch-stop pit 276, 286 is provided at a selected location of the substrate 270, 280 corresponding to the location at which an inside corner 275, 285 of the intersecting V-grooves 274, 284 would otherwise be formed. Providing the etch-stop pit 276, 286 coated with an etch-stop layer at the selected location prevents formation of the inside convex corner 275, 285.

Figure 30:
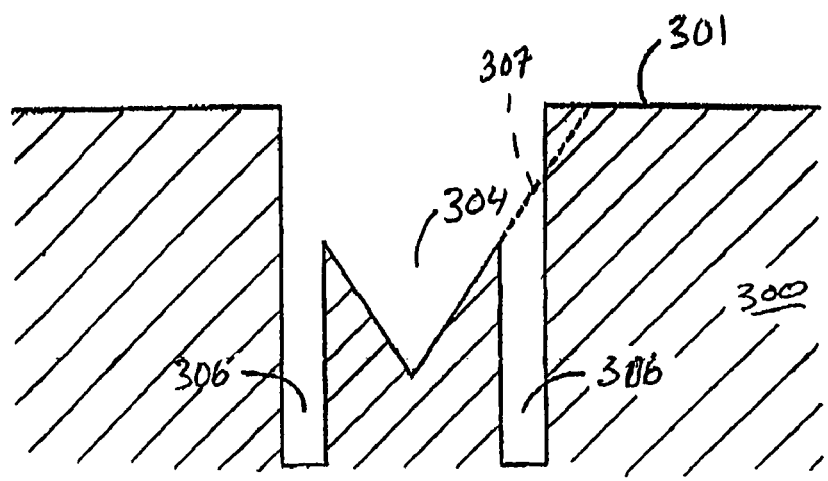

In a further aspect of the present invention, an etch-stop pit 296 may be provided as a continuous boundary that circumscribes a region of the substrate 294 that is to be anisotropically etched. Providing such an etch-stop pit boundary permits the anisotropically etched features to be etched more deeply than otherwise possible. For example, referring to FIG. 30, a cross-sectional view of a substrate 300 is shown in which a recessed V-groove 304 is provided. The ability to form the V-groove 304 below the plane of the upper surface 301 is provided by the presence of the etch-stop pit 306 (coated with an etch-stop layer) which circumscribes the region in which the V-groove 304 is formed. If the etch-stop pit 306 were not provided, the surfaces of the V-groove 304 would extend upward to the upper surface 301 as indicated by the dashed line 307, and thus would not be recessed with respect to the upper surface 301.

Figures 29A, 29C:
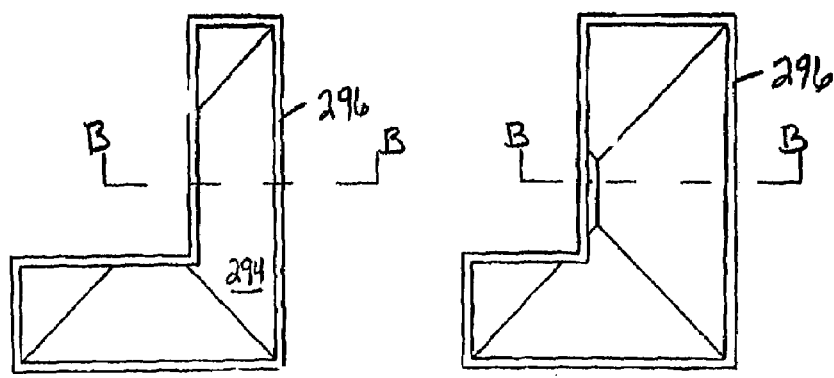
FIGS. 29A–29D, 30, 31, 32A–32B, and 33 schematically illustrate top and cross-sectional views (29B, 29D, 30, 32B) of substrates having an etch-stop pit which circumscribes a selected area of the substrate in which an anisotropically etched feature is formed.
Figures 29B, 29D:
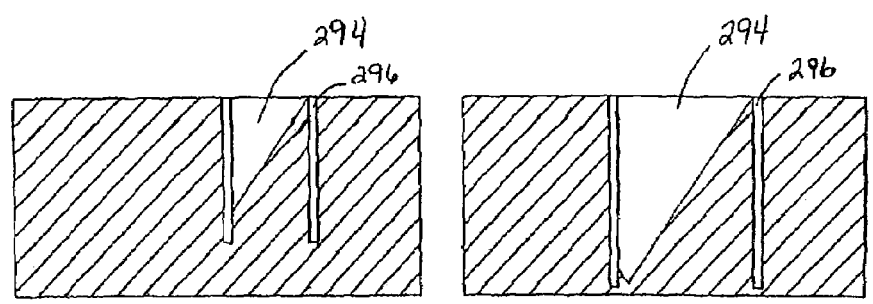
Figure 31:
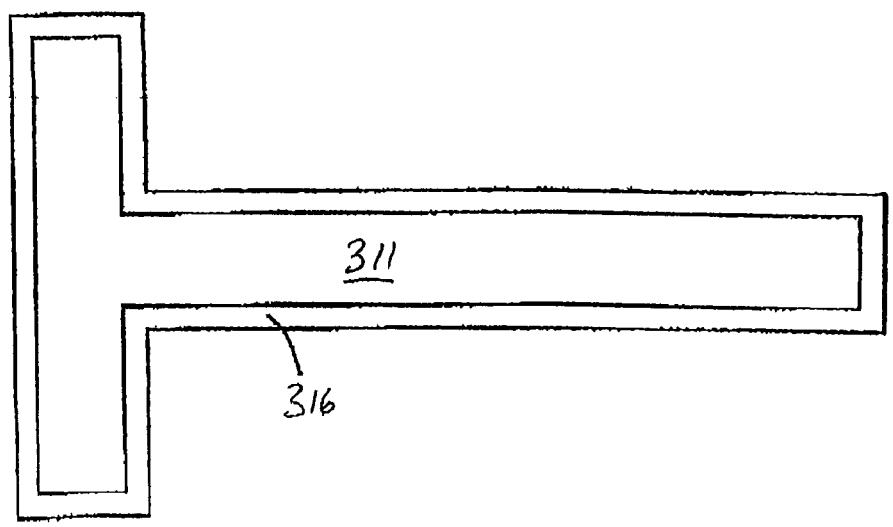
Figure 32A:
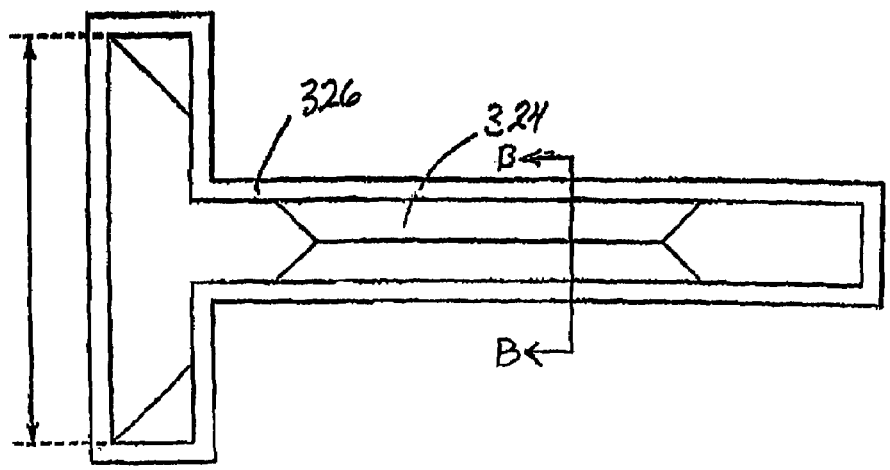
Figure 32B:
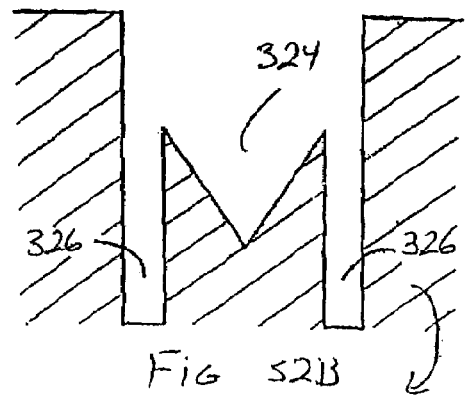
Figure 33:
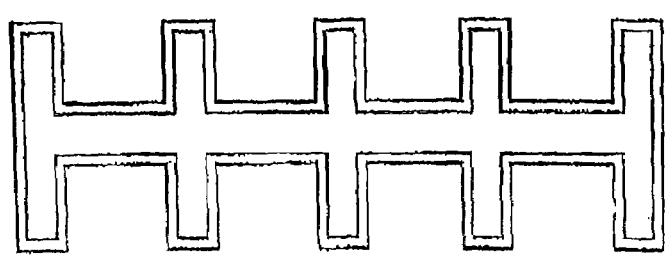

Turning now to FIGS. 29A–D, an L-shaped etch-stop pit 296 is provided which circumscribes an L-shaped area in which an anisotropically etched feature may be formed. Providing the L-shaped etch-stop pit 296 permits the formation of {111} sidewalls as illustrated in FIGS. 29A and 29B. Etching the wider pit 296 as illustrated in FIGS. 29C and 29D permits a deeper feature to be formed. Alternatively, other shapes than L-shaped may be utilized as an etch-stop pit. For example, the etch-stop pit 316 may have a T-shaped cross-section as illustrated in the top view of FIG. 31. Upon anisotropically etching the region 311 bounded by the T-shaped etch-stop pit 316, {111} sidewalls may be formed as illustrated in FIGS. 32A and 32B. In the vicinity of the cross-sectioning plane B—B, the anisotropically etched feature 324 may have a V-shaped cross-section, as illustrated in FIG. 32B. Yet further shapes may be utilized in accordance with the present invention as an etch-stop pit which circumscribes an area to be anisotropically etched, such as the configuration depicted in FIG. 33.

Figure 34:
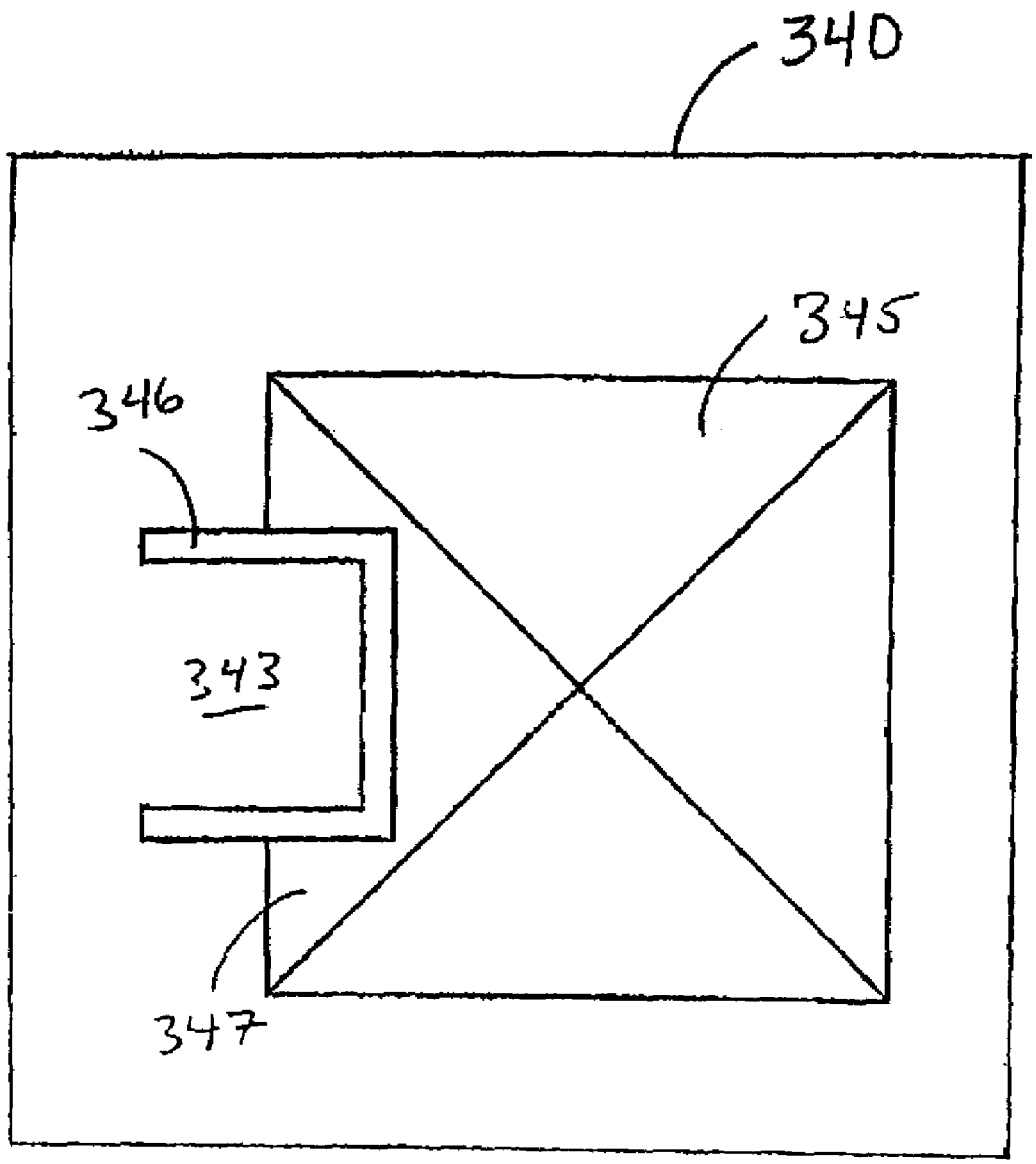
FIGS. 34, 35A, 36, and 37 schematically illustrate top views of substrates having a U-shaped etch-stop pit adjacent to a V-pit to provide a location on the substrate for a laser mount and to provide a location for retaining a spherical optical element.
Figure 35A:
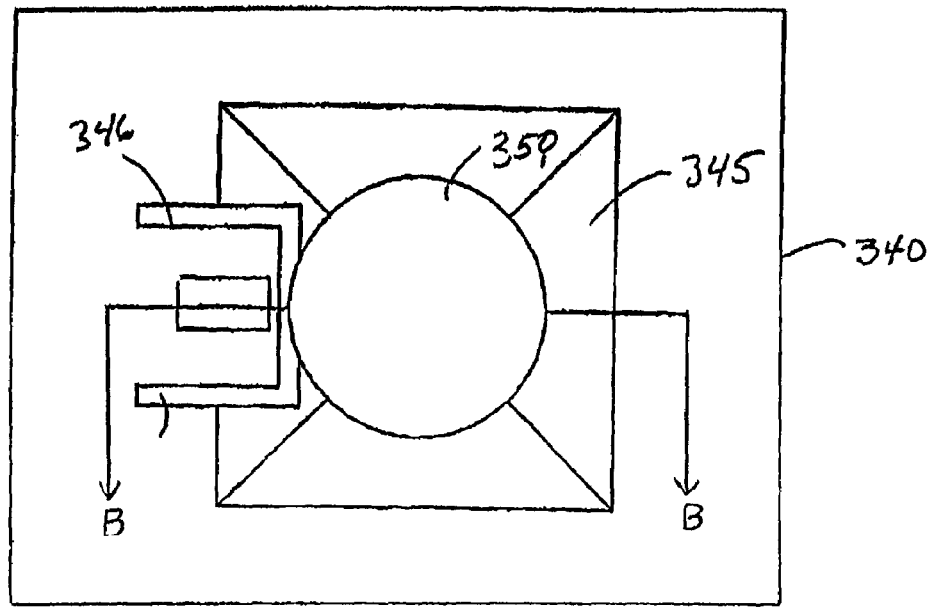
Figure 35B:
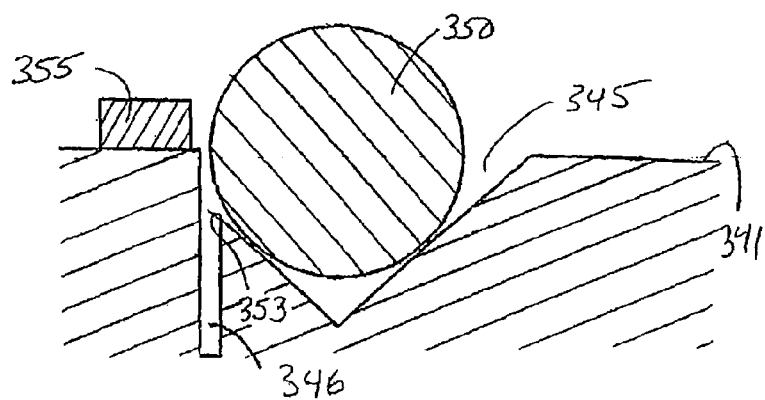
FIG. 35B schematically illustrates a cross-sectional view of the substrate illustrated in FIG. 35A.
Figure 36:
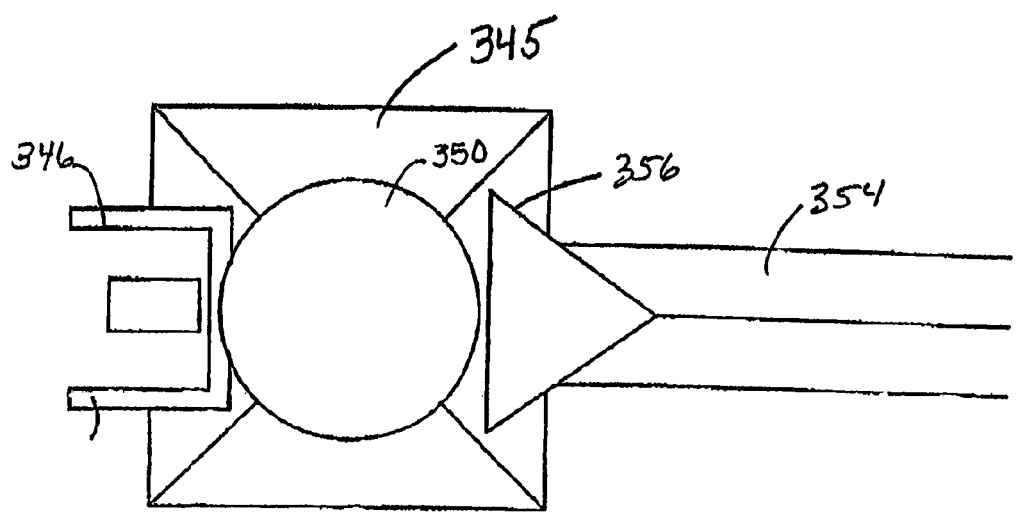

In yet another aspect of the present invention, a U-shaped etch-stop pit 346 is provided adjacent to a V-pit 345 to provide a location on a substrate 340 for mounting an optical element, such as a laser mount 355, and to provide a location for retaining an optical element, such as a spherical optical element 350, as illustrated in FIGS. 34–36. FIGS. 34 and 35A illustrate a top view of a substrate 340 in which a U-shaped etch-stop pit 346 is provided adjacent a V-pit 345. The U-shaped etch-stop pit 346 includes sidewalls that extend a selected depth into the substrate 340. Optionally, the sidewalls of the U-shaped etch-stop pit 346 may be vertical, as illustrated in FIG. 34. Alternatively, the sidewalls of the U-shaped etch-stop pit 346 may be inclined relative to the upper surface 301 of the substrate 340. The sidewalls of the U-shaped etch-stop pit 346 are conformally coated with an etch-stop layer, or, optionally, the etch-stop pit 346 is filled etch-stop layer material. In addition, the portion 343 of the substrate surface 301 interior to the etch-stop pit 346 may be provided with an etch-stop layer. As explained above with reference to the process of FIGS. 2A–2D, the etch-stop layer comprises a material that is resistant to the etching used to form an anisotropically etched feature, such as V-pit 345.

After the desired etch-stop layer or layers are provided, the V-pit 345 may be formed by anisotropic etching by the same methods used to form V-grooves but using a square aperture mask. Instead of using a perfectly square aperture mask, a generally square-aperture that includes a protrusion to protect substrate surface portions 343 interior to the etch-stop pit 346 may be used. The V-pit 345 may be anisotropically etched at the same time as the optional V-groove 354. The V-pit 345 should extend into the substrate a depth less than the depth of the etch-stop pit 346 at the point of intersection 353 between the V-pit 345 and the etch-stop pit 346, as illustrated in FIG. 35B. In a configuration where the V-pit 345 does not intercept the etch-stop pit 346, the V-pit 345 depth does not need to be selected with regard to the depth of the etch-stop pit 346.

Figure 37:
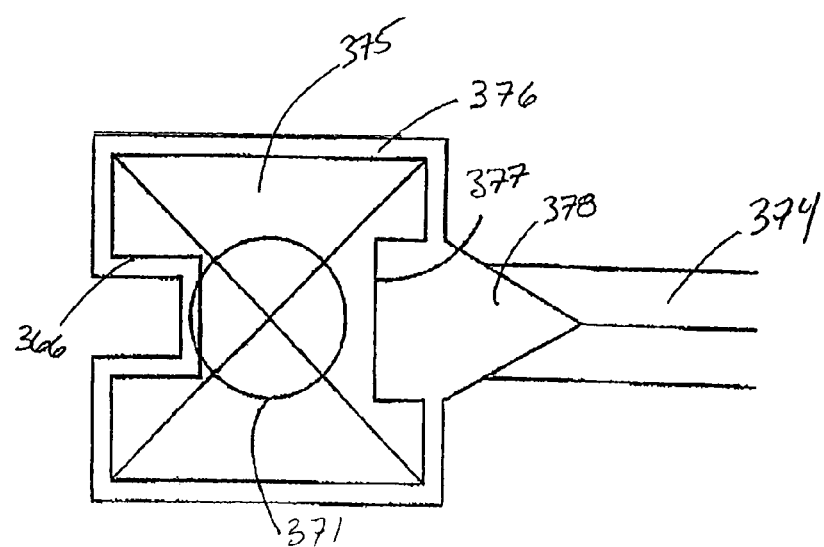

The V-pit 345 provides a convenient shape for retaining a spherical optical element, such as a ball lens 350. The interior portion 343 of the substrate surface 301 provides a convenient location at which a laser 355, or other optical device, may be located for optical communication with the ball lens 350. Providing the U-shaped etch-stop pit 346 permits a portion of the V-pit 345 adjacent the etch-stop 346 to be recessed below the surface 341 of the substrate 340. Such a recess permits the ball lens 350 to be positioned more closely to the laser 355, as illustrated in FIG. 35B. This is particularly useful for lenses with a focal point that would otherwise exist in free-space. For example, a ball lens of cubic zirconia has a refractive index near 2.0. The ideal location for a edge emitting laser for a collimating design with such a lens would be as close to the surface of the ball lens as possible. A V-pit etched by traditional means, and designed to place the circumference of the lens near the elevation of the of the silicon surface, would prevent a laser to be placed on the surface of the silicon from being sufficiently close to the lens surface. The platform 343 would prevent such a problem, and can be constructed to meet this and similar placement needs. In addition, a V-groove 354, 374 may also be provided for optical communication between a fiber disposed with the V-groove 354, 374 and the V-pit, as illustrated in FIGS. 36 and 37. With respect to FIG. 36, the V-groove 354 may be fabricated in a similar manner as the V-grooves 174 of FIG. 17, for example. Alternatively, as illustrated in FIG. 37, the etch-stop pit 376 may circumscribe the region in which the V-pit 375 is formed. The etch-stop pit 376 comprises a U-shaped segment 366 to provide an analogous function to that of the U-shaped etched pit 346 in the configuration of FIG. 35A. The etch-stop pit 376 also comprises a triangular-shaped segment 378 to prevent formation of a wedge-shaped end wall in the V-groove 374 and to provide a fiber stop 377.

In still another aspect of the present invention, FIGS. 65–69 illustrate several configurations of etch-stop pits in combination with V-grooves and/or V-pits which are suited to permit redirection of light out of the plane of the substrate to/from an optical fiber disposed within the plane of the substrate. Such a configuration is particularly suited for optical communication with surface normal optical or opto-electronic element, such as a VCSEL. Each of the structures in FIGS. 65–69 may desirably be formed by the process described above with reference to FIG. 2D, with an etch-stop pit and etch-stop layer provided in the substrate prior to anisotropically etching the V-grooves/V-pits.

Figure 65A:
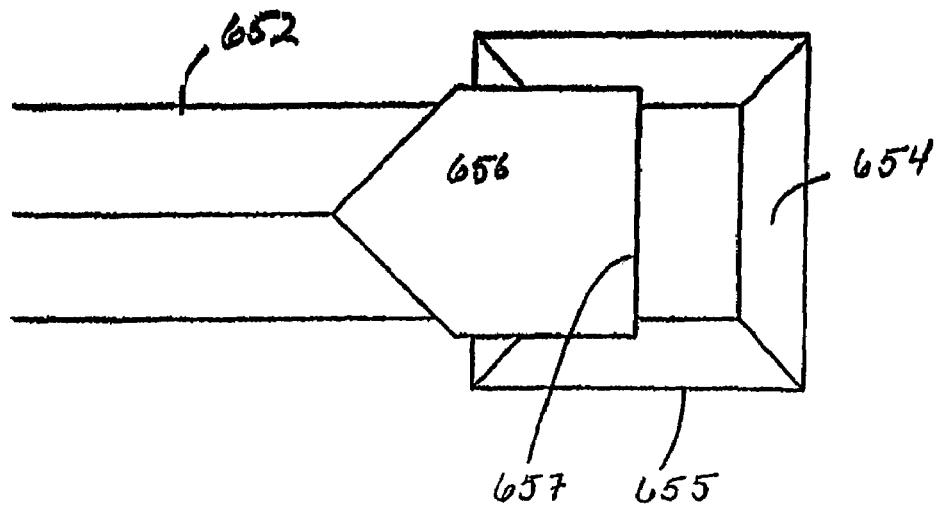
FIG. 65A schematically illustrates a top view of a substrate having a V-groove and a truncated V-pit with an etch-stop pit therebetween, where the V-pit provides a reflector surface for reflecting light out of the plane of the substrate and the etch-stop pit provides a fiber stop.
Figure 65B:
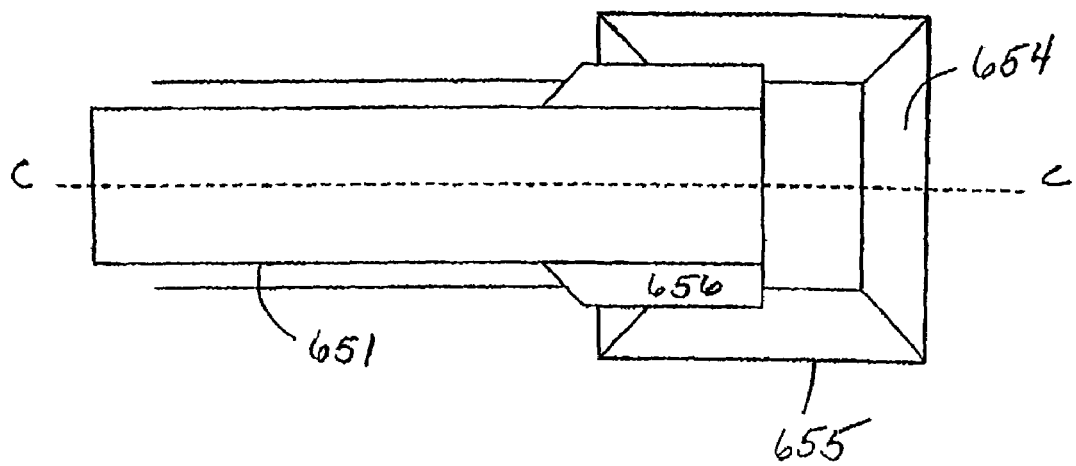
FIGS. 65B and 65C schematically illustrate a top view and a cross-sectional side view taken along the line A—A in FIG. 65B, respectively, of the substrate of FIG. 65A but with an optical fiber disposed in the V-groove.
Figure 65C:
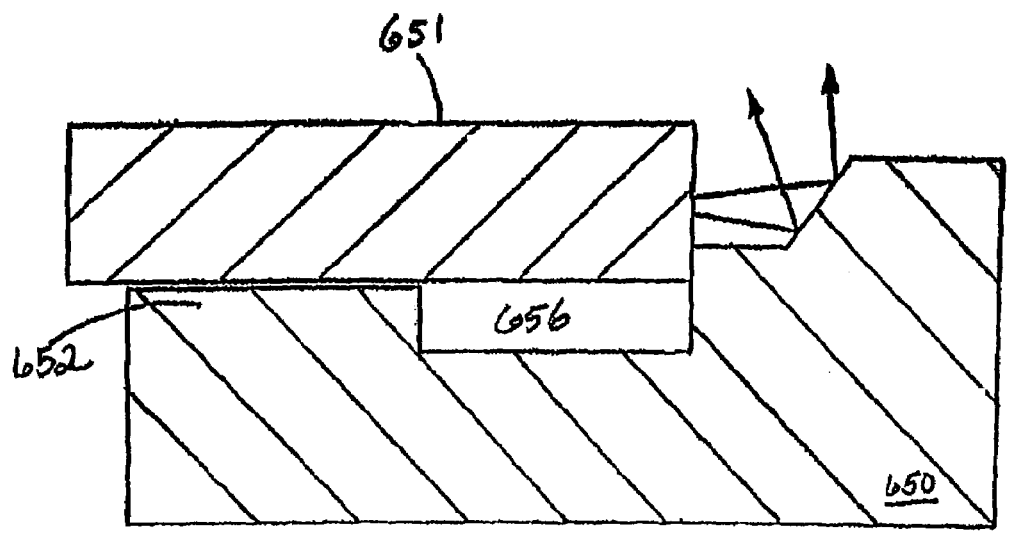
Figure 66:
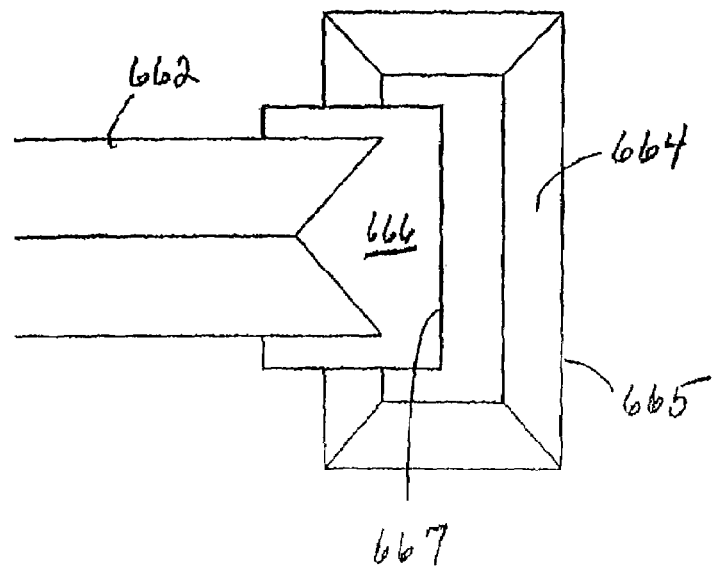
FIG. 66 schematically illustrates a top view of an alternative configuration of a substrate having a V-groove and a V-pit with an etch-stop pit therebetween, where the V-pit provides a reflector surface for reflecting light out of the plane of the substrate and the etch-stop pit provides a fiber stop.
Figure 70:
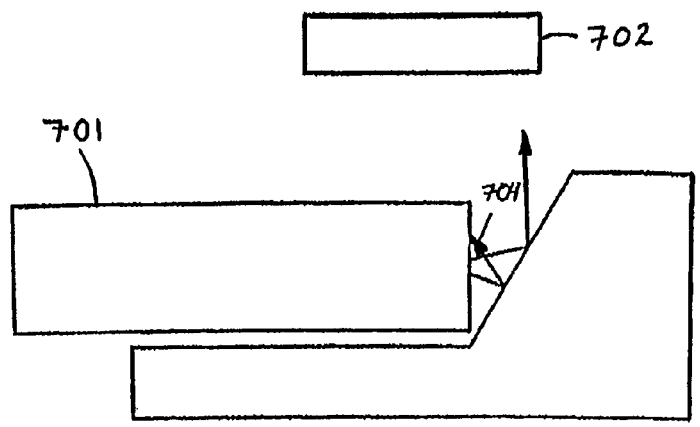
FIG. 70 schematically illustrates a side view of an optical fiber disposed in a V-groove.

For example, referring to FIGS. 65A–65C, a substrate 650 is shown in which a fiber V-groove 652 and a truncated V-pit 655 are disposed. An etch-stop pit 656 in the shape of a pentagon is disposed between V-groove 652 and V-pit 655, with a triangular portion of the pentagon directed into the V-groove 652, in a similar manner as the triangular etch-stop pit 16 intersects the V-groove 12 of FIG. 2D, to prevent the formation of a wedge-shaped end wall in the V-groove 652 at the end adjacent the etch-stop pit 656. As illustrated in FIG. 65C, the etch-stop pit 656 provides a vertical surface that functions as a fiber stop 657 against which optical fiber 651 may abut, in a similar manner to the fiber stop 17 of the etch-stop pit 16 of FIG. 2D. The etch-stop pit 656 is disposed on the substrate at a location that permits the mechanical stop 657 to be so that the end face of the fiber 651 may be accurately located relative to the opposing V-pit inclined sidewall 654 to prevent the problem illustrated in FIG. 70, where some of the light 704 from the fiber 701 fails to reach an optical device 702 because the light 704 is reflected back on to the fiber 701. The situation illustrated in FIG. 70 is particularly problematic with microscopic submounts made from anisotropically etched single crystal silicon, because the angles of the V-groove sidewalls are fixed by the crystal structure.

Accurate positioning of the fiber endface is important when the optical spot size needs to be accurately controlled, as is the case in photodetectors where the optical spot size is usually made to fill ~>=90% of the active diffused junction, or in the case of VCSELS being coupled to multimode fiber where a gap of ~100 um is often used to allow the beam to expand to more fully fill the fiber core. Moreover, it is particularly important in micro-optics, laser coupling, and fiber optic component packaging, that distances between the optical lenses, fibers, and active devices are often controlled on the order of tens of microns down to several microns or smaller to produce optimal results and coupling consistency.

Various other configurations of V-groove, etch-stop pit, and V-pit are possible to achieve the effects illustrated in FIGS. 65A–65C. For example, referring to FIG. 66, an etch-stop pit 666 of a different shape from that of the etch-stop pit 656 may be provided between a fiber V-groove 662 and truncated V-pit 664. The etch-stop pit 666 may still comprise a triangular portion for intersection with the V-groove 662 to prevent the formation of a wedge-shaped end wall in the V-groove 662. Like the etch-stop pit 656, the etch-stop pit 666 provides a fiber stop 667, and the V-pit 665 provides a reflector surface 664.

Figure 67A:
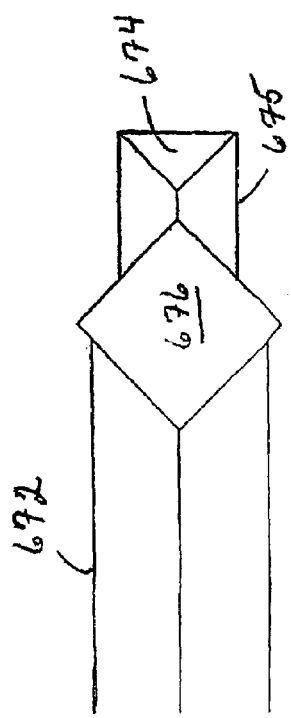
FIG. 67A schematically illustrates a top view of a substrate having two V-grooves with an etch-stop pit therebetween, where the one of the V-grooves provides a reflector surface for reflecting light out of the plane of the substrate and the etch-stop pit provides a fiber stop.
Figure 67B:
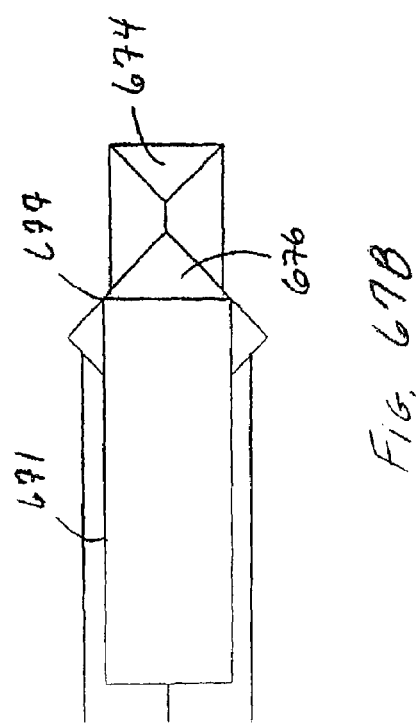
FIG. 67B schematically illustrates a top view of the substrate of FIG. 67A but with an optical fiber disposed in one of the V-grooves.

Still other configurations are possible for providing out-of-plane reflection of light to and from an optical fiber, as illustrated in FIGS. 67A and 67B. Such reflectors can be made with 54.74 degree facets when using <100> oriented silicon, or for example, can produce 45 degree facets when off-axis cut <100> wafers are used by slicing the ingot 9.74 degrees off the <100> axis as is known in the art. As shown and FIGS. 67A and 67B, a fiber V-groove 672 is provided adjacent to an etch-stop pit 676 which includes a triangular portion extending into the area of the V-groove 672 to prevent the formation of a wedge-shaped end wall in the V-groove 672. In this case, a reflector surface 674 may be provided by a reflection V-groove 675 disposed on an opposing side of the etch-stop pit 676 from the fiber V-groove 672. The etch-stop pit 676 also includes a triangular portion extending into the area of the reflection V-groove 675 to prevent the formation of a wedge-shaped end wall in the reflection V-groove 675. Accordingly, the etch-stop pit 676 may be diamond-shaped as shown in FIGS. 67A and 67B. The sidewalls of the etch-stop pit 676 closest to the reflection V-groove 675 may provide a fiber stop 677 for a fiber 671, as shown in FIG. 67B.

Figure 68A:
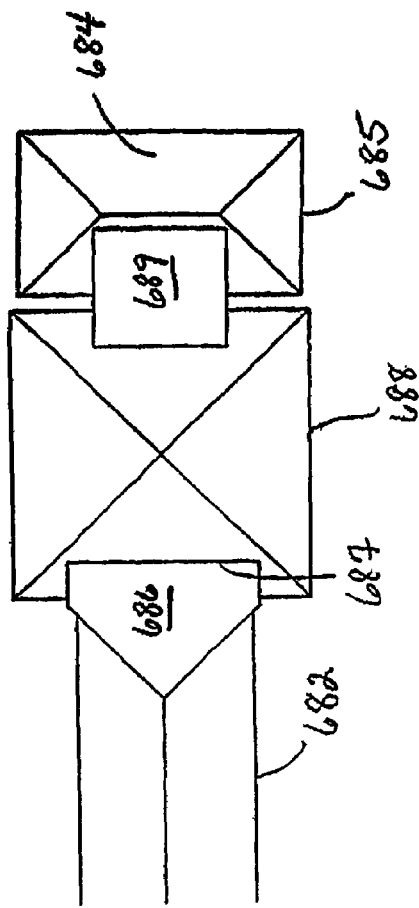
FIG. 68A schematically illustrates a top view of a substrate having two V-grooves with two etch-stop pits and a V-pit disposed therebetween, where the one of the V-grooves provides a reflector surface for reflecting light out of the plane of the substrate and one the etch-stop pits provides a mechanical stop which can be used to align a fiber along the surface.
Figure 68B:
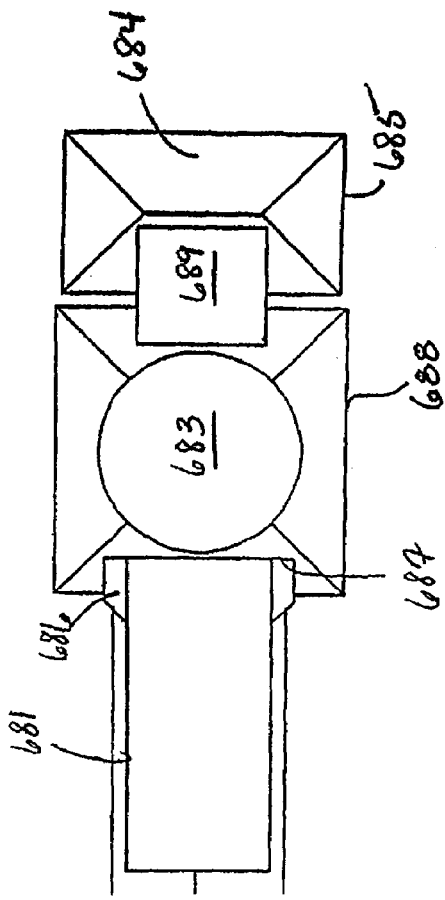
FIG. 68B schematically illustrates a top view of the substrate of FIG. 68A but with an optical fiber disposed in one of the V-grooves.

In addition to the above configurations for providing out-of-plane reflection of light to and from an optical fiber, other configurations are possible, including ones that provide a lens between the optical fiber and the reflector surface, such as those shown in FIGS. 68A and 68B. For example, a fiber V-groove 682 is provided adjacent to an etch-stop pit 686 which includes a triangular portion extending into the area of the V-groove 682 to prevent the formation of a wedge-shaped end wall in the V-groove 682. The etch-stop pit 686 also extends into a V-pit 688 for holding the ball lens 683. This configuration is useful, for example, for single mode fiber devices where beam expansion and path length without a lens would prevent sufficient coupling between fibers and active devices. A reflection V-groove 685 is disposed in the substrate to provide a reflector surface 684 for optical communication with a fiber 681 disposed in the fiber groove 682. In addition, to prevent that portion of the light beam below the upper surface of the substrate from being occluded, a clearance etch-stop pit 689 may be provided intermediate the ball lens of the pit 688 and the reflection V-groove 685.

Figure 69A:
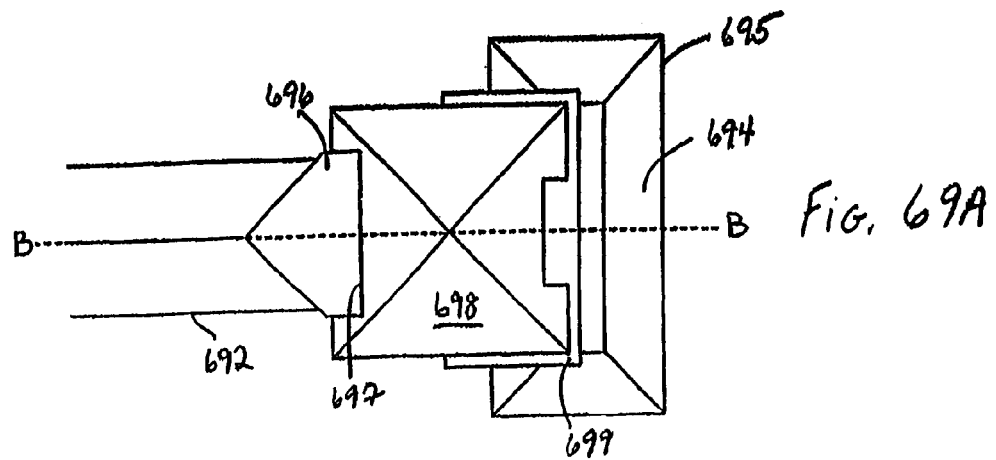
FIG. 69A schematically illustrates a top view of an alternative configuration of a substrate having two V-grooves with two etch-stop pits and a V-pit disposed therebetween, where the one of the V-grooves provides a reflector surface for reflecting light out of the plane of the substrate and one the etch-stop pits provides a fiber stop.
Figure 69B:
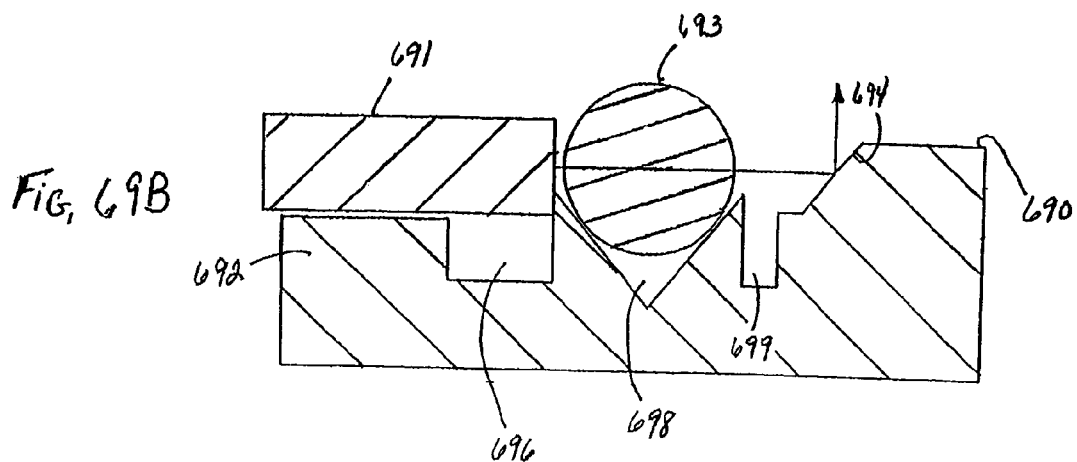
FIG. 69B schematically illustrates a side cross-sectional view taken along the line A—A in FIG. 69A but with an optical fiber disposed in one of the V-grooves and a ball lens disposed in the V-pit.
Figure 69C:
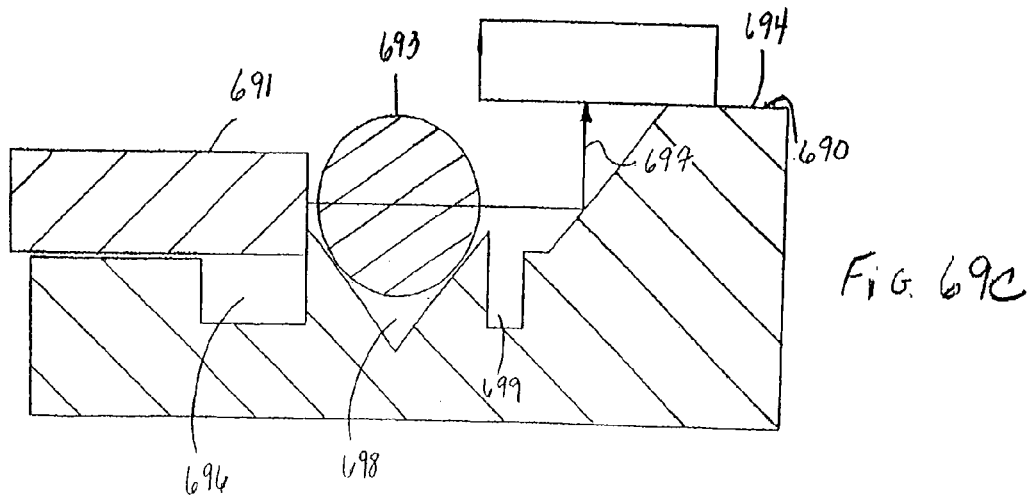
FIG. 69C schematically illustrates a side cross-sectional view similar to that of FIG. 69B but having the optical fiber and ball lens disposed below and upper surface of the substrate.

Various other configurations of V-grooves and etch-stop pits are also possible to achieve the effects illustrated in FIGS. 68A and 68B. For example, referring to FIGS. 69A and 69B, a clearance etch-stop pit 699 of a different shape from that of the etch-stop pit 689 may be provided between a reflection V-groove 695 and a lens V-pit 698. With the exception of the shape of the clearance etch-stop pit 699, the remaining structures illustrated in FIGS. 69A and 69B are analogous to those illustrated in FIGS. 68A and 68B. The removal of substrate material in the region of etch-stop pit 699 permits light from the fiber 691 to reach the reflector surface 694. This particular configuration of clearance etch-stop pit 699 permits the reflector surface 694 to be located closer to a ball lens 693 than is the case in the configuration of FIGS. 68A and 68B. In addition, as illustrated in FIG. 69C the substrate can be configured so that the fiber 691 and ball lens 693 lie below the upper surface 690 of the substrate. This permits an optical device 693 to be cantilevered from the upper surface 690 to communicate with an optical beam 697. The beam shown in 69C is shown at 45 degrees. This can be achieved in practice with off-axis cut silicon wafers, however more typically a 54.74 degree facet would be found producing a beam 697 reflecting to the left of the position shown. An exemplary version of FIG. 69C would be in coupling a VCSEL to a single mode fiber. In this case, the VCSEL active area can overhang the reflector facet bouncing the optical beam toward the fiber. The angular deviation produced by a 54.74 degree facet can be corrected by optimizing the height of the ball lens, allowing the beam to be focused and captured within the N.A. of a single mode (or multimode) fiber.

Alternatively, the substrate can be configured so that the fiber and ball lens extend above the upper surface of the substrate and an optical device may be suspended above the upper surface.

In a further aspect of the present invention, FIGS. 71–75 illustrate several configurations of ring-shaped etch-stop pits disposed within a wet-etched pit to provide wedge-shaped protrusions in the wet-etched pit, which protrusions may be used as a reflecting surface, mounting structure, neuroprobes, or any application in which sharp edges or points are desired. Further examples of related structures are found in U.S. patent application Ser. No. 10/076,858, the entire contents of which are incorporated herein by reference. Each of the structures in FIGS. 71–75 may desirably be formed in a manner similar to that described above where an etch-stop pit is provided in the substrate and coated with an etch-stop layer and then an anisotropic (wet etched) feature is etched. The case of the configuration of FIGS. 71–75, the region of anisotropic etching surrounds and includes the location(s) of the etch-stop pit(s).

Figure 71A:
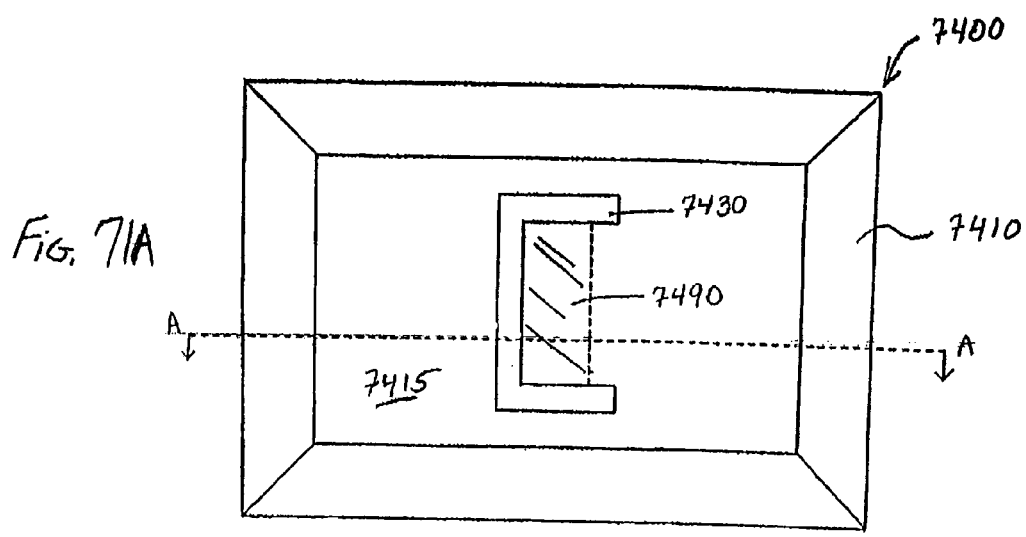
Figure 71B:
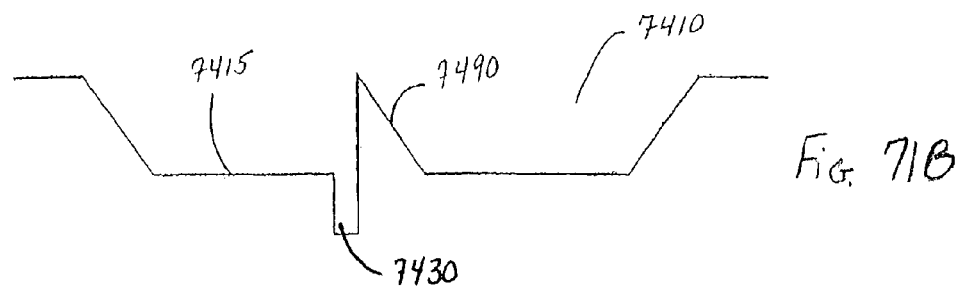

For example, referring to FIGS. 71A and 71B, a substrate 7400 is shown in which a wedge 7490 is provided on the flat bottom 7415 of a wet-etched pit 7410. In order to form the wedge 7490, first a U-shaped etch-stop pit 7430 is dry etched or machined into the substrate 7400. The etch-stop pit 7430 is then coated with an etch-stop layer. The substrate 7400 is then masked to provide a rectangular opening corresponding to the outer perimeter of the wet-etched pit 7410, and the area of the substrate 7410 within the masked opening may be anisotropically etched to simultaneously form the wet-etched pit 7410 and the wedge-shaped protrusion 7490. That is, during the wet etching, both the inclined sidewalls of the wet-etched pit 7410 and the inclined sidewall of the wedge-shaped protrusion 7490 are formed and the etch-stop pit 7430 forms a ring about the wedge-shaped protrusion 7490.

In another configuration multiple U-shaped etch-stop pits 7530 may be used to provide multiple wedge-shaped protrusions 7590, as illustrated in FIG. 72. Specifically, four U-shaped etch-stop pits 7530 with etch-stop layer may be oriented relative to one another to form a "+", with the open portion of each "U" positioned adjacent the center of the "+". Subsequent anisotropic etching in a similar manner to that described above with regard to FIGS. 71A and 71B produces a wet-etched pit 7510 and four wedge-shaped protrusions 7590 with each wedge-shaped protrusion 7590 inclined downward towards the center of the "+" to provide a pocket 7595 into which a ball lens or other object may be seated. Other ring shapes of etch-stop pits may also be used. For example, with reference to FIGS. 73A and 73B, generally triangular etch-stop pits 7630 may be oriented in a "+" configuration to provide a similar structure to that illustrated in FIG. 72.

In particular, the etch-stop pits 7690 may take the form of a truncated triangle in which one apex of the triangle is not present to provide an open end of the triangle. The open end of each triangular etch-stop pit 7690 is positioned adjacent the center of the "+". Subsequent anisotropic etching in a similar manner to that described above with regard to FIG. 72 produces a wet-etched pit 7610 and four wedge-shaped protrusions 7690 interior to each etch-stop pit 7690, with each wedge-shaped protrusion 7690 inclined downward towards the center of the "+" to provide a pocket 7695 into which a ball lens or other object may be seated, as seen in FIG. 73B. In addition to providing a wet-etched pit 7610 and wedge-shaped protrusion 7690 on a substrate 7600, other features may be provided, such as a V-pit 7620 for retaining a ball lens or 7625, to provide an optical bench as shown in FIG. 73C.

Figure 74A:
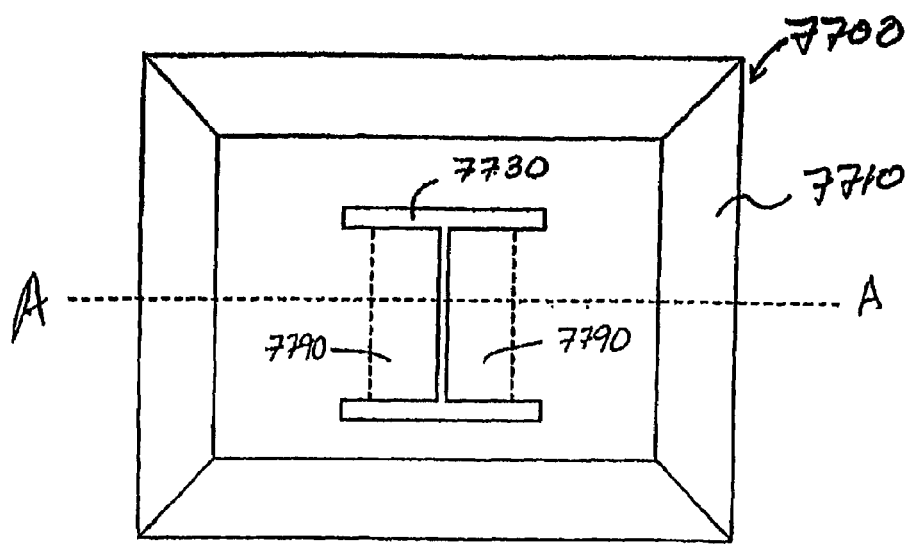
FIGS. 74A and 74B schematically illustrate a top view and a side cross-sectional view taken along the line A—A in FIG. 74A, respectively, of a substrate having an "I"-shaped etch stop pit disposed within a wet-etched pit to provide two wedge-shaped protrusions in the wet-etched pit.
Figure 74B:
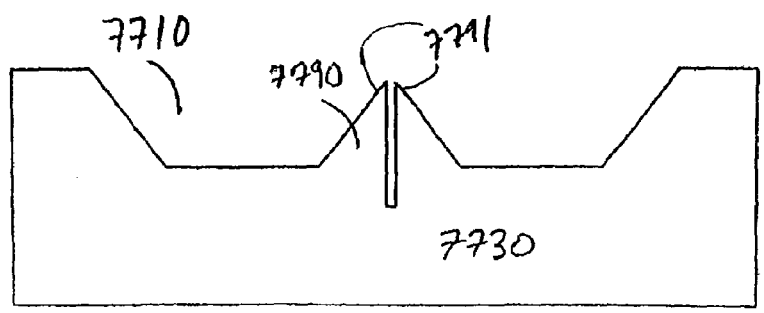
Figure 75:
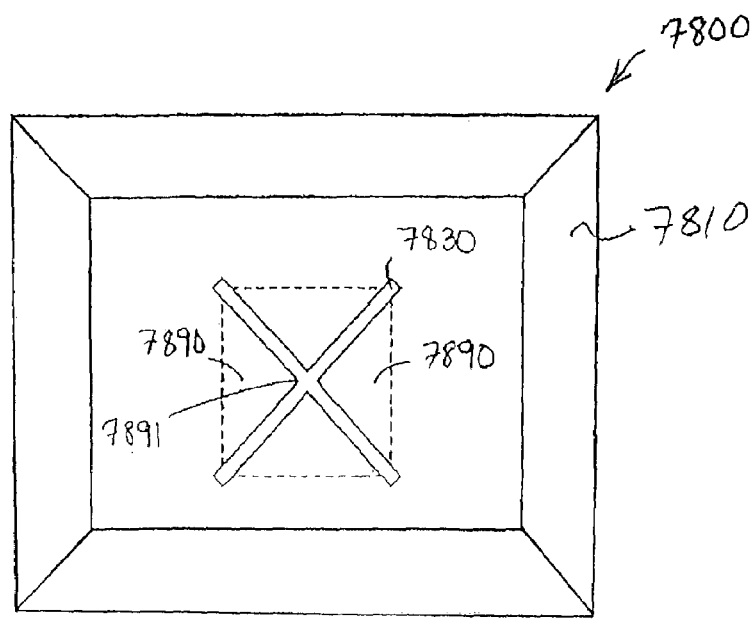
FIG. 75 schematically illustrates a top view of a substrate having an "X"-shaped etch stop pit disposed within a wet-etched pit to provide four wedge-shaped protrusions in the wet-etched pit.

In addition to providing mounting structures, wet etching processes in the present invention may be utilized to provide structures suitable for us in various devices such as probe tips, emission sources, microfluidic nozzles, and/or out-of-plane light reflecting surfaces. For example, an "I"-shaped etch-stop pit 7730 may dry etched or machined into a substrate 7700, as illustrated in FIGS. 74A and 74B. The etch-stop pit 7730 is then coated with an etch-stop layer. The substrate 7700 is masked to provide rectangular opening corresponding to the outer perimeter of the wet-etched pit 7710 and the area of the substrate 7700 within the masked opening may be anisotropically etched to simultaneously form the wet-etched pit 7710 and the wedge-shaped protrusions 7790. A knife-sharp tip 7791 is provided at the top of each wedge 7790 which can be made very close together, the distance between each tip 7791 being determined by the width of the vertical portion of the "I". Alternatively, an etch-stop pit 7830 may be provided in the form of an "X" followed by subsequent wet etching, to provide a wet-etched pit 7810 comprising four wedge-shaped projections 7890, as illustrated in FIG. 70.

Methods of Fabrication

Figure 40:
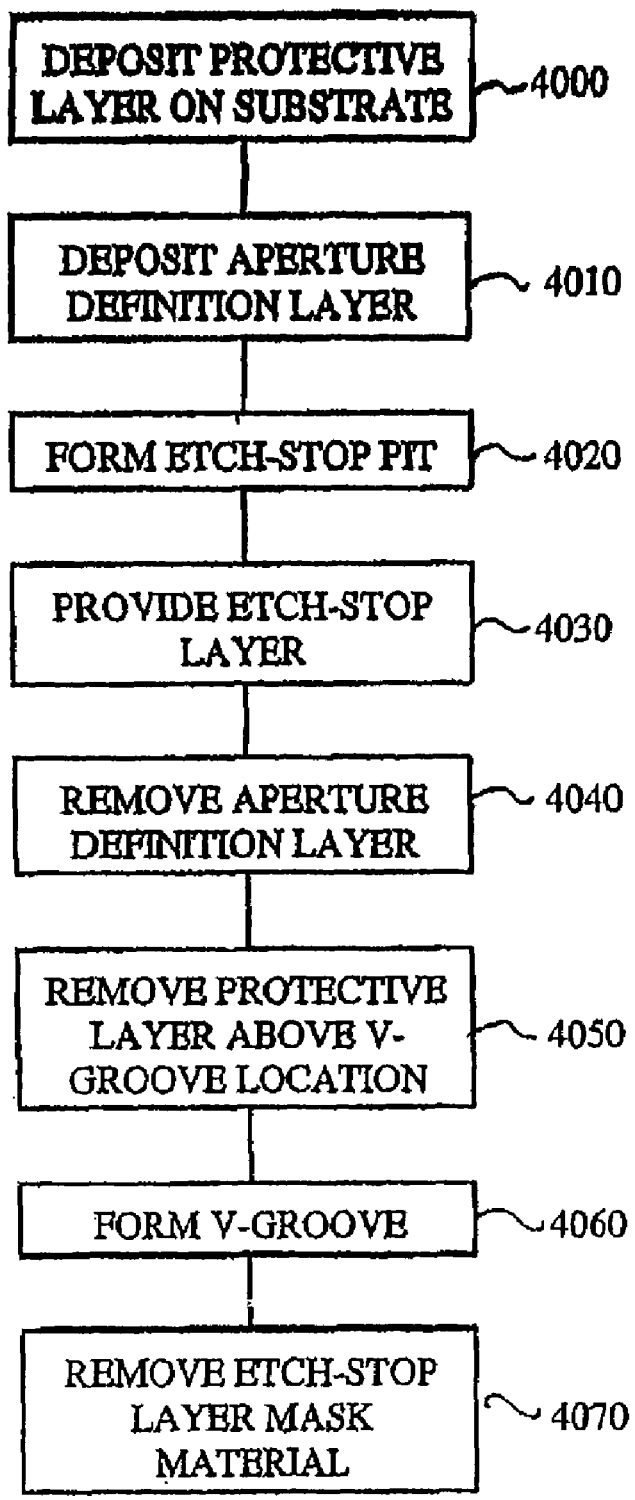
FIG. 40 illustrates a flowchart representing a process in accordance with the present invention for creating an etch-stop pit and an adjacent anisotropically etched feature.
Figure 41:
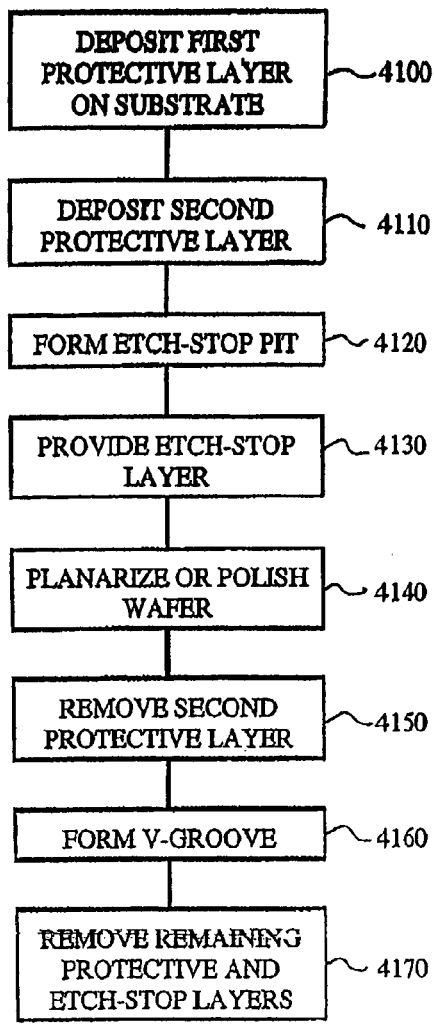
FIG. 41 illustrates a flowchart representing another process of the present invention for creating an etch-stop pit and adjacent an anisotropically etched feature.
Figure 42:
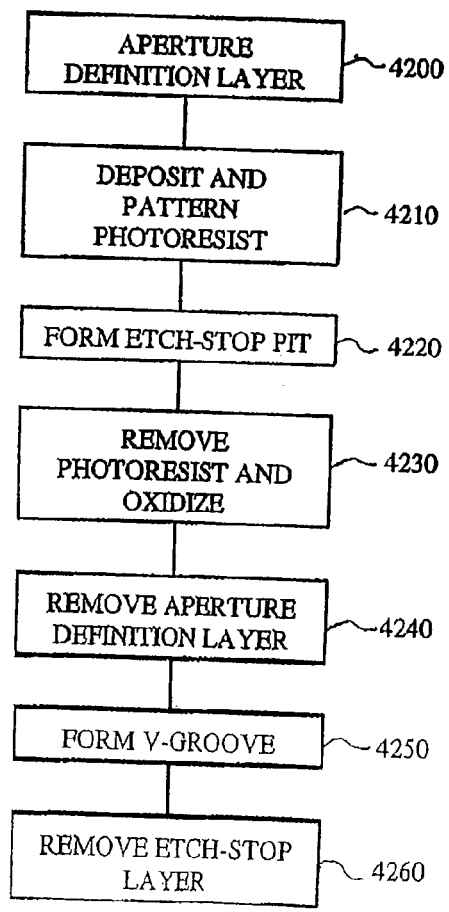
FIG. 42 illustrates a flowchart representing yet another process of the present invention for creating an etch-stop pit and an adjacent anisotropic feature.

In accordance with the present invention, there are provided methods for fabricating optical subassemblies having an etch-stop pit and an adjacent recessed area, such as an anisotropically etched area, for receiving an optical element. Three exemplary methods are illustrated in the flowcharts of FIGS. 40–42 and the accompanying side cross-sectional views of FIGS. 45–64. The orientation of the side cross-sectional views of FIGS. 45–64 is illustrated in FIGS. 43 and 44.

Figure 43:
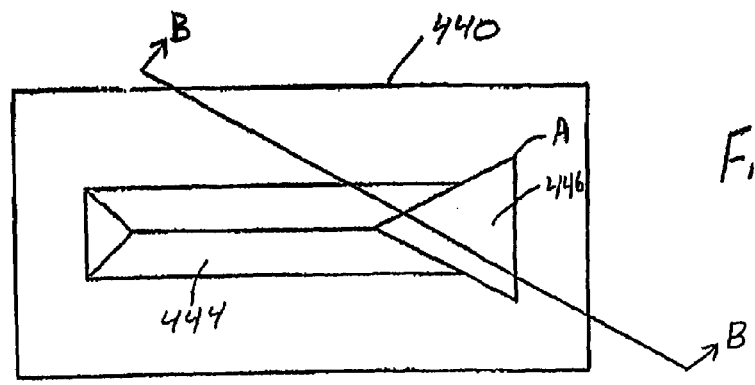
FIGS. 43 and 44 schematically illustrate a top view and a cross-sectional view, respectively, of a substrate comprising a V-groove and an adjoining etch-stop pit.

Referring to FIG. 43, a top elevational view is shown of a substrate 440 in which a V-groove 444 and adjacent etch-stop pit 446 are provided. The structure shown in FIG. 43 is similar to that shown in FIG. 2D, where one of the wedge-shaped end walls is eliminated from the V-groove 444. A cross-sectional view taken along the line B—B is illustrated in FIG. 44 to show a cross-section of the V-groove 444 at a location where the V-groove 444 intersects the etch-stop pit 446. FIGS. 45–64 illustrate cross-sectional views of substrates which are taken along the same view direction, B—B, as the cross-sectional view in FIG. 44. The exemplary part fabricated by each of the methods illustrated in the flowcharts of FIGS. 40–42 has a final configuration similar to that of the device shown in FIGS. 43 and 44.

Figure 44:
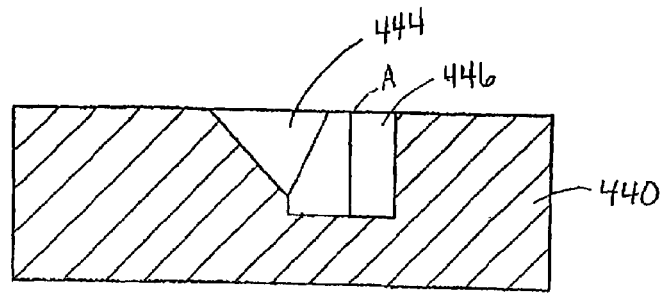
Figure 45:
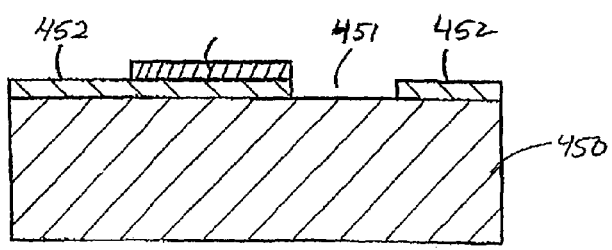
FIGS. 45–51 schematically illustrates cross-sectional views of a substrate at selected steps of processing in accordance with the method illustrated in the flowchart of FIG. 41.

Referring now to FIG. 40, there is shown a flowchart illustrating a method in accordance with the present invention for creating the device illustrated in FIGS. 43 and 44. As illustrated in FIG. 45, a substrate 450 made from <100>-oriented Si is provided. The processing of the substrate 450 begins at step 4000 of FIG. 40 by providing a protective layer 452 on a first surface of the substrate 450 to cover that portion of the substrate 450 in which the etch-stop pit 516 is not to be provided. That is, the protective layer 452 includes an etch-stop pit aperture 451 through which a portion of the substrate 450 surface is accessible for forming the etch-stop pit 516.

The protective layer 452 may be deposited over the entire surface of the substrate 450. Thereafter, portions of the protective layer 452 may be removed to expose the surface of the substrate 450 at the selected area for the etch-stop pit 516. The material of the protective layer 452 is chosen to be resistant to the etchant that will be used to form the V-groove 512. For example, silicon dioxide is one suitable material. The silicon dioxide may be deposited by CVD or may be provided by thermal oxidation of the substrate surface. The silicon dioxide layer should be thick enough to serve as a mask during the etch-stop pit formation.

Following the application of the protective layer 452, an aperture definition layer 454 is deposited, at step 4010, over a selected portion of the protective layer 452, as shown in FIG. 45. The aperture definition layer 454 is provided so that an aperture 457 may be provided, as explained below, through which the V-groove 512 will be etched. The location of the aperture definition layer 454 is selected to cover that portion of the substrate surface at which the V-groove 512 is to be located.

Figure 46:
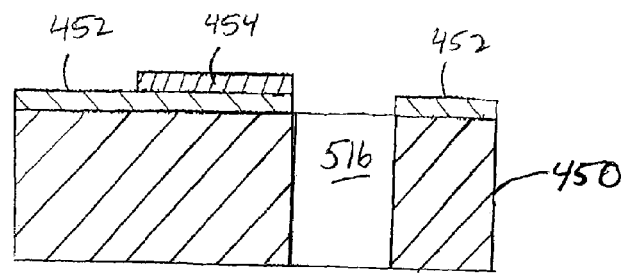

Processing continues with the selective removal, at step 4020, of a portion of the substrate 450 located within the etch-stop pit aperture 451 to form an etch-stop pit 516 in the substrate 450, as depicted in FIG. 46. The etch-stop pit 516 may conveniently be formed by reactive ion etching, plasma etching, ion milling, or by any other directional process. In addition, the etch-stop pit 516 may be formed by other methods such as isotropic or anisotropic etching, so long as the etch-stop pit 516 attains the desired shape and depth.

Figure 47:
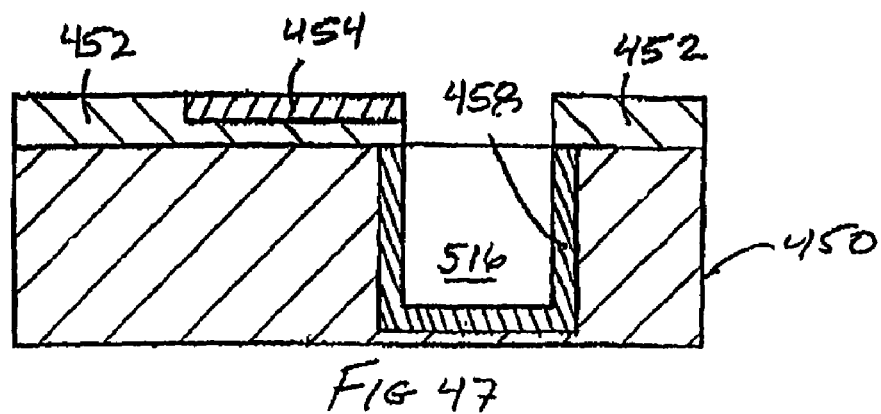

Having created the etch-stop pit 516, the surfaces of the etch-stop pit 516 are covered, preferably conformally, with an etch-stop layer 458, at step 4030, as illustrated in FIG. 47. The etch-stop layer 458 may be conveniently provided by thermally oxidizing the substrate to provide an etch-stop layer 458 comprising silicon dioxide. An appropriate choice for the etch-stop layer 458 includes any material that is resistant to the etchant which will be used to create the V-groove 512. During the thermal oxidation step 4030, the previously deposited silicon dioxide protective layer 452 increases in thickness and surrounds the perimeter of the aperture definition layer 454, as illustrated in FIG. 47.

Figure 48:
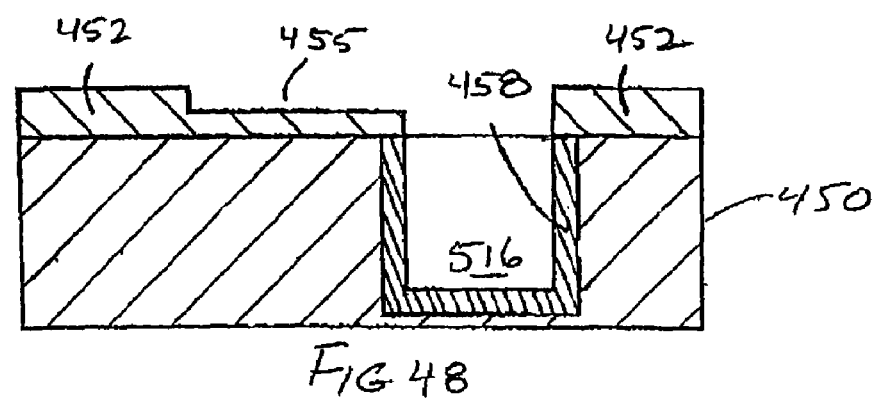
Figure 49:
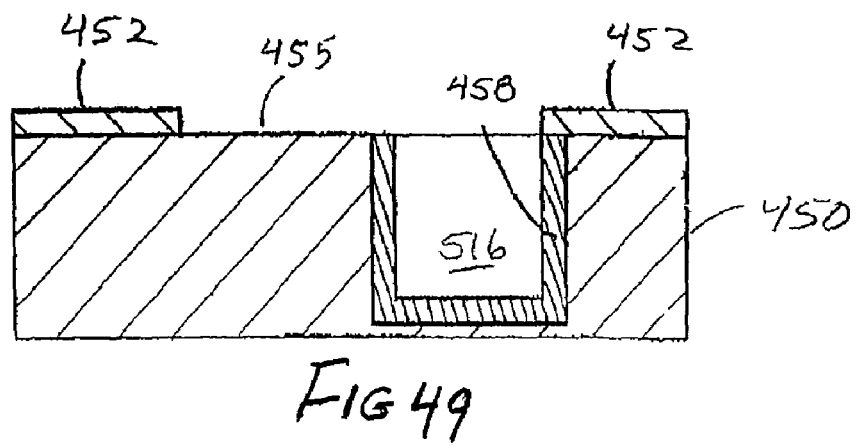

With the etch-stop layer 458 in place, processing continues by removing, at step 4040, the aperture definition layer 454 to provide a V-groove aperture 455 in the protective layer 452, as shown in FIG. 48. A sufficient thickness of the protective layer 452 is removed, at step 4050, to expose the surface of the substrate 450 disposed below the aperture definition layer 454 so that the V-groove aperture 455 communicates with the surface of the substrate 450. A portion of the protective layer 452 and the etch-stop layer 458 remain on the surfaces where the V-groove 512 will not be formed, as illustrated in FIG. 49. A suitable process for removing a thickness of the protective layer 452 is a short duration, wet or dry, oxide etch.

Figure 50:
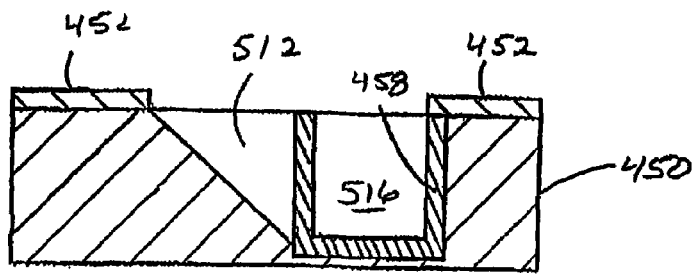
Figure 51:
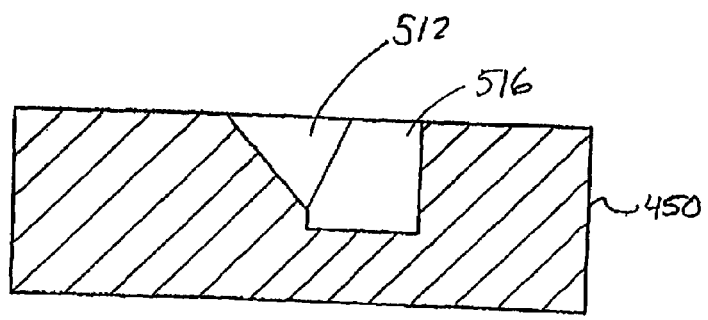

Next, as shown in FIG. 50, the portion substrate 450 accessible through the V-groove aperture 455 is selectively removed, at step 4060, to form the V-groove 512, as illustrated in FIG. 50. Appropriate processes for the formation of the V-groove 512 include anisotropic etching with EDP or TMAH. KOH may also be used; however, since KOH can attack the protective layer 452 and etch-stop layer 458, KOH should only be used if the protective layer 452 and etch-stop layer 458 are sufficiently thick so as not to be completely removed by the KOH. As a final optional step, the remaining portions of the protective layer 452 and etch-stop layer 458 may be removed at step 4070, to yield the device illustrated in FIG. 51.

Figure 52:
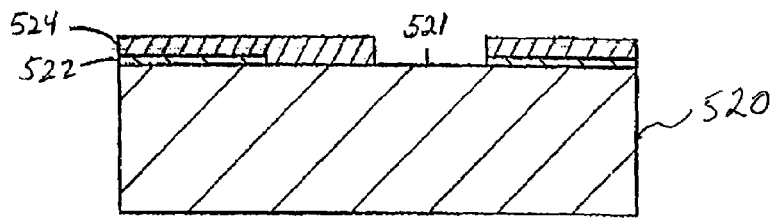
FIGS. 52–58 schematically illustrates cross-sectional views of a substrate at selected steps of processing in accordance with the method illustrated in the flowchart of FIG. 42.

Referring now to FIGS. 41 and 52–58, another method in accordance with the present invention is illustrated for creating the device shown in FIGS. 43 and 44. As illustrated in FIG. 52, a substrate 520 made from <100>-oriented Si is provided. The processing of the substrate 520 begins at step 4100 of FIG. 41 by providing a first protective layer 522 on a first surface of the substrate 520 to cover that portion of the substrate 520 in which neither the etch-stop pit 586 nor the V-groove 582 is to be provided.

The first protective layer 522 may be deposited over the entire surface of the substrate 520. Thereafter, portions of the first protective layer 522 may be removed to expose the surface of the substrate 520 at the selected areas for the etch-stop pit 586 and the V-groove 582. The material of the first protective layer 522 is chosen to be resistant to the etchant that will be used to form the V-groove 582. For example, silicon nitride is one suitable material. The silicon nitride may be deposited by CVD.

Following the application of the first protective layer 522, a second protection layer 524 is deposited, at step 4110, over a selected portion of the first protective layer 522 and the substrate surface where the V-groove 582 is to be formed, as shown in FIG. 52. The second protection layer 524 includes an aperture 521 through which the etch-stop pit 586 may be formed. The second protection layer 524 may comprise a CVD oxide, phospho-silicate glass, or boro-phospho-silicate glass, for example.

Figure 53:
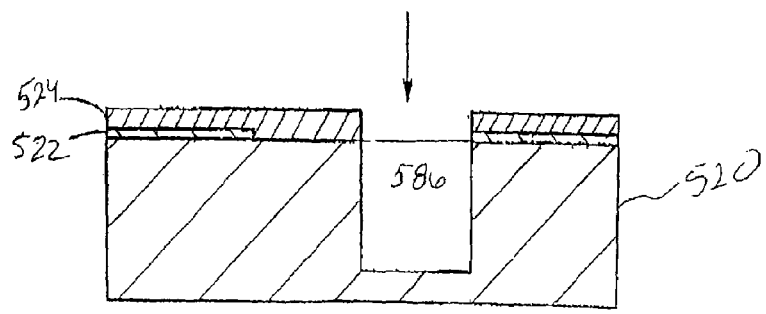

Processing continues with the selective removal, at step 4120, of a portion of the substrate 520 located within the etch-stop pit aperture 521 to form an etch-stop pit 586 in the substrate 520, as depicted in FIG. 53. The etch-stop pit 586 may conveniently be formed by reactive ion etching, plasma etching, ion milling, or by any other directional process. In addition, the etch-stop pit 586 may be formed by other methods such as isotropic or anisotropic etching, so long as the etch-stop pit 586 attains the desired shape and depth.

Figure 54:
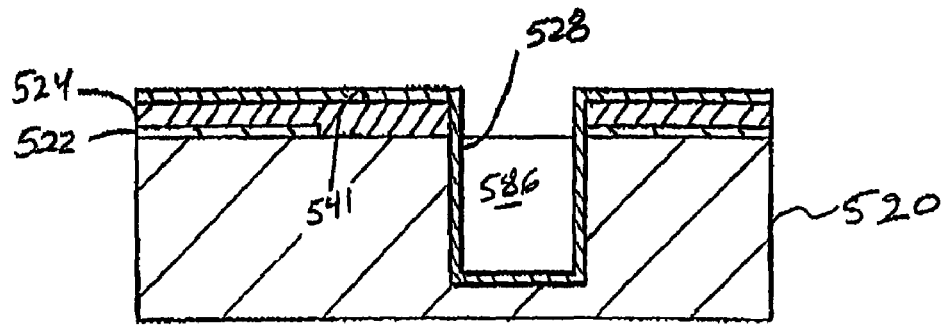

Having created the etch-stop pit 586, the surfaces of the etch-stop pit 586 and second protective layer 524 are covered, preferably conformally, with an etch-stop layer 528, at step 4130, as illustrated in FIG. 54. The etch-stop layer 528 may be conveniently provided by CVD. An appropriate choice for the etch-stop layer 528 includes any material that is resistant to the etchant which will be used to create the V-groove 582, such as silicon nitride.

Figure 55:
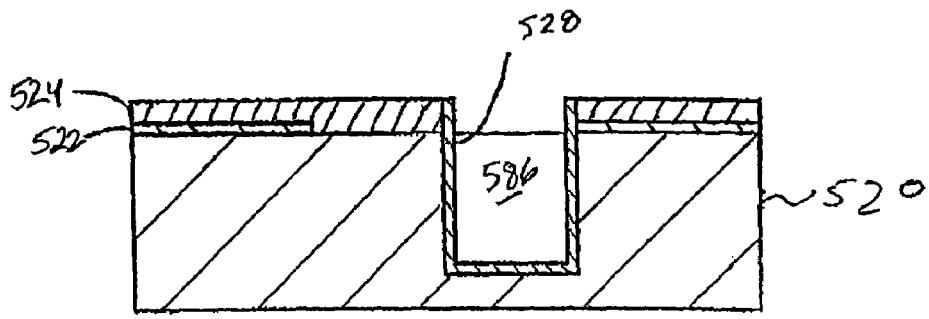
Figure 56:
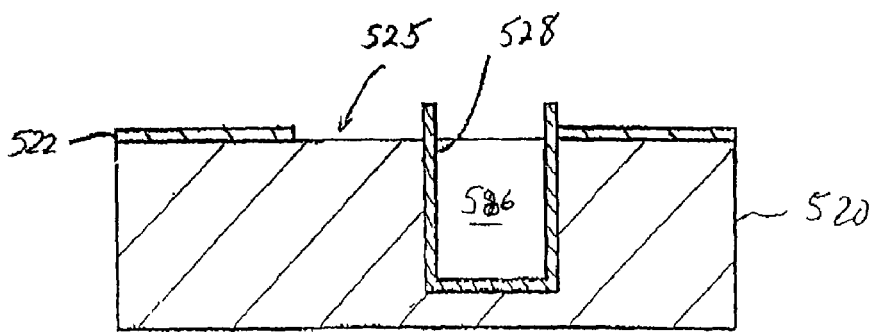

With the etch-stop layer 528 in place, processing continues by removing, at step 4140, the portion of the etch-stop layer 528 disposed on the upper surface 541 of second protective layer 524. The portion of the etch-stop layer 528 disposed within the etch-stop pit 586 is retained, as illustrated in FIG. 55. The removal step 4140 may be performed by any suitable method such as planarization or polishing. Subsequently, at step 4150, a second protective layer 524 is removed, as shown in FIG. 56, to provide a V-groove aperture 525. A suitable method for removing the second protective layer 524 includes etching with dilute HF.

Figure 57:
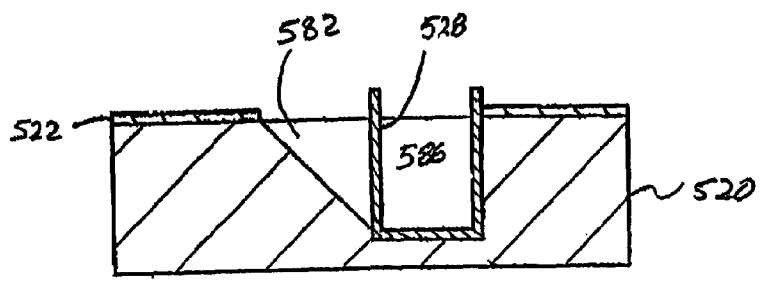
Figure 58:
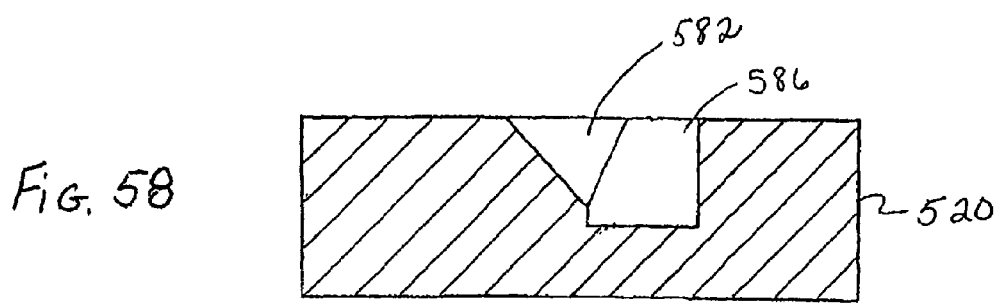

Next, as shown in FIG. 57, the portion substrate 520 accessible through the V-groove aperture 525 is selectively removed, at step 4160, to form the V-groove 582, as illustrated in FIG. 50. Appropriate processes for the formation of the V-groove 582 include anisotropic etching with KOH. As a final optional step, the remaining portions of the first protective layer 522 and etch-stop layer 528 may be removed at step 4170, to yield the device illustrated in FIG. 58.

Figure 76:
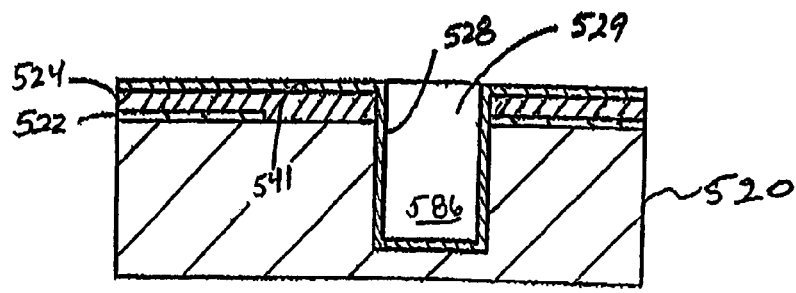
FIGS. 76–80 schematically illustrate additional, optional steps for use with the method illustrated in FIGS. 52–58.
Figure 77:
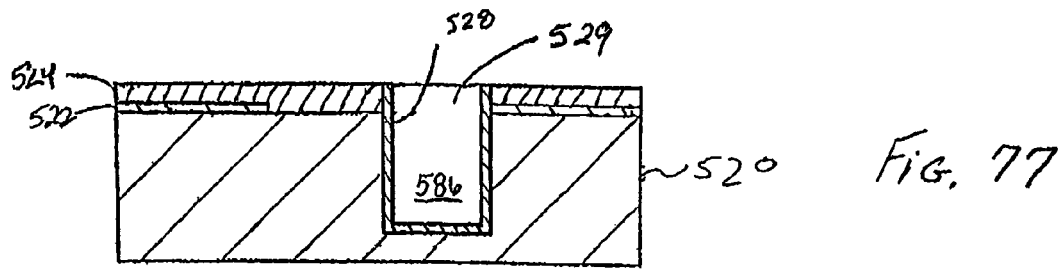
Figure 78:
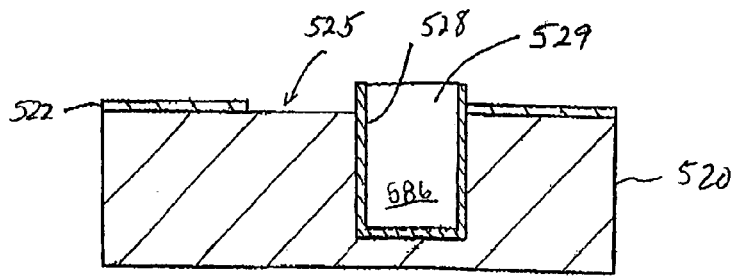
Figure 79:
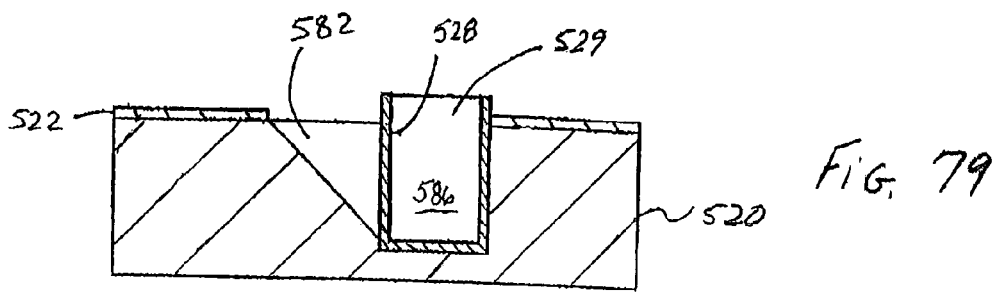
Figure 80:
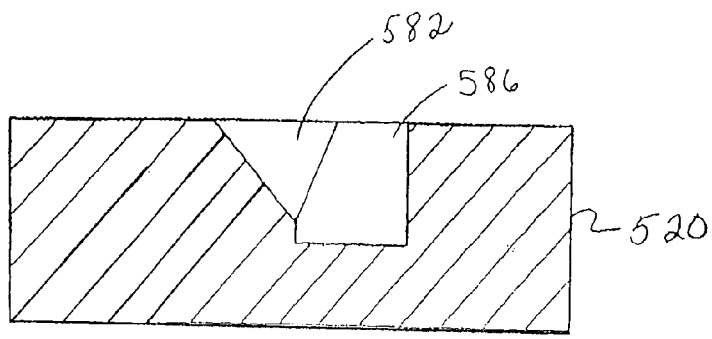

Optionally, after the step of FIG. 54, the etch-stop pit 586 can be filled with a fugitive mask material 529 that resists nitride etches (e.g., wax, polymer or photoresist), FIG. 76. After filling the etch-stop pit 586, the portion of the etch-stop layer 528 on the upper surface 541 is removed by etching, FIG. 77. Subsequently, the second protective layer 524 is etched away, FIG. 78. Then the substrate 520 is wet etched, FIG. 76. Finally, the fugitive mask material 529, etch-stop layer 528, and first protective layer 522 are removed, FIG. 80.

Figure 59:
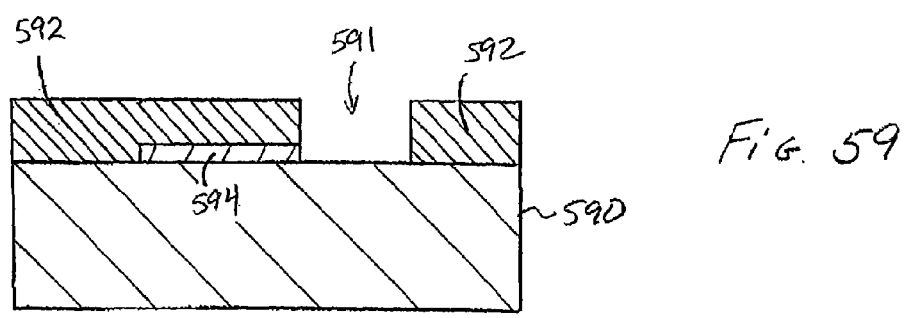
FIGS. 59–64 schematically illustrates cross-sectional views of a substrate at selected steps of processing in accordance with the method illustrated in the flowchart of FIG. 43.

Referring now to FIGS. 42 and 59–64, yet another method in accordance with the present invention is illustrated for creating the device shown in FIGS. 43 and 44. As illustrated in FIG. 59, a substrate 590 made from <100>-oriented Si is provided. The processing of the substrate 590 begins at step 4200 of FIG. 42 by providing protective an aperture definition layer 594 deposited over a selected portion of the substrate 590, as shown in FIG. 59. The location of the aperture definition layer 594 is selected to cover that portion of the substrate surface at which the V-groove 632 is to be located. A suitable material for use as the aperture definition layer 524 is silicon nitride.

Figure 60:
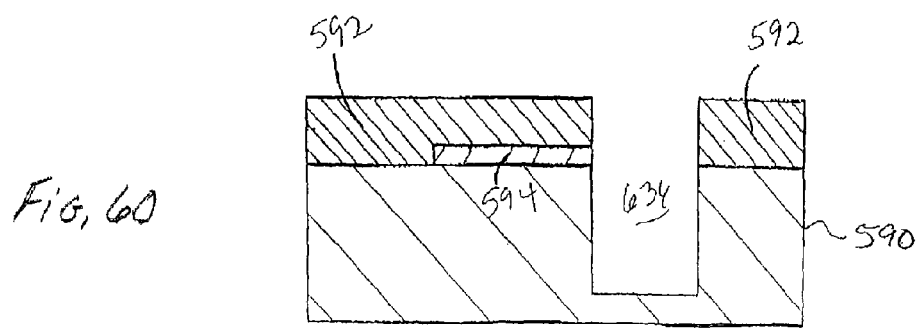

The processing of the substrate 590 continues, at step 4210, by providing a photoresist layer 592 over the aperture definition layer 594 and over the portions of the substrate 590 not covered by the aperture definition layer 524. Photoresist layer 592 is patterned, using methods known in the art, to provide an etch-stop pit aperture 591, as illustrated in FIG. 59. Processing continues with the selective removal, at step 4220, of a portion of the substrate 590 located within the etch-stop pit aperture 591 to form an etch-stop pit 636 in the substrate 590, as depicted in FIG. 60. The etch-stop pit 636 may conveniently be formed by a process which does not remove the aperture definition layer 594. In addition, the etch-stop pit 636 may be formed by other methods such as isotropic or anisotropic etching, so long as the etch-stop pit 636 attains the desired shape and depth.

Figure 61:
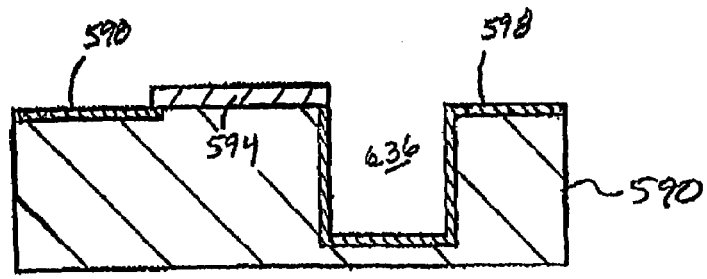
Figure 62:
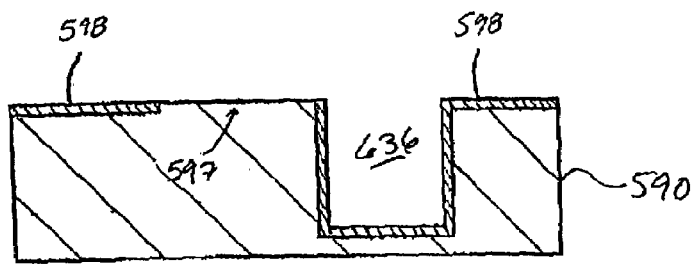

Having created the etch-stop pit 636, the photoresist layer 592 is removed, at step 4230. The surfaces of the etch-stop pit 636 and exposed surfaces of the substrate 590 are oxidized to form an etch-stop layer 598, at step 4230, as illustrated in FIG. 61. With the etch-stop layer 598 in place, processing continues by removing, at step 4240, the aperture definition layer 594 to provide an un-oxidized region 597 of the substrate 590, as shown in FIG. 62.

Figure 63:
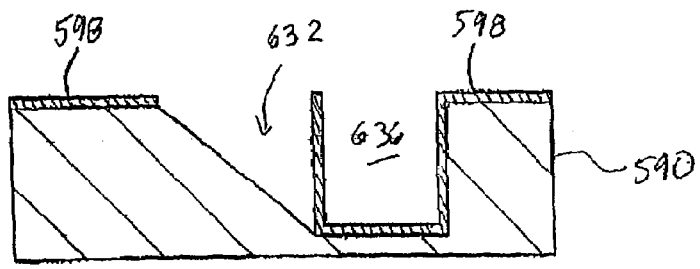
Figure 64:
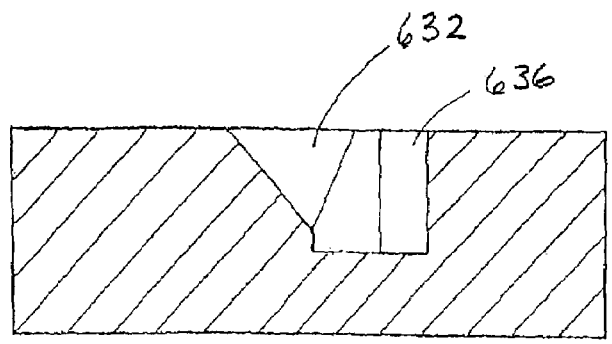

Next, as shown in FIG. 63, the un-oxidized region 597 of the substrate 590 is selectively removed, at step 4250, to form the V-groove 632, as illustrated in FIG. 63. Appropriate processes for the formation of the V-groove 632 include anisotropic etching with EDP or TMAH. KOH may also be used; however, since KOH can attack oxide etch-stop layer 598, KOH should only be used if the etch-stop layer 598 is sufficiently thick so as not to be completely removed by the KOH. As a final optional step, the remaining portions of the etch-stop layer 598 may be removed at step 4260, to yield the device illustrated in FIG. 64.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. For example, a non-anisotropically etched feature may be formed adjacent an etch-stop pit. It should therefore be understood that this invention is not limited to the particular embodiments described herein, but is intended to include all changes and modifications that are within the scope and spirit of the invention as set forth in the claims.

What is claimed is:

1. A method for micromachining a crystalline substrate, comprising:
   providing a crystalline substrate;
   directionally etching a first etch-stop pit in the substrate;
   coating the first etch-stop pit with a mask material;
   anisotropically wet etching an area adjacent to the first etch-stop pit to provide a groove for holding an optical element, wherein the groove is disposed in the substrate;
   anisotropically wet etching a first wet-etched pit after formation of the first etch-stop pit, the first wet-etched pit comprising a sidewall to provide a reflection surface for optical communication with an optical element held in the groove,
   wherein the first etch-stop pit is disposed between the groove and the first wet-etched pit.

2. The method according to claim 1, comprising:
   directionally etching a second etch-stop pit in the substrate;
   coating the second etch-stop pit with a mask material;
   anisotropically wet etching an area between the first and second etch-stop pits to provide a second wet-etched pit between the first and second etch-stop pits.

3. The method according to claim 1, wherein the first etch-stop pit comprises a first sidewall portion that intersects the groove at a non-orthogonal angle relative to a longitudinal axis of the groove so that formation of at least a portion of a wedge-shaped end portion of the groove is prevented and comprises a second sidewall portion that intersects the first wet-etched pit so that formation of at least a portion of a sidewall of the first wet-etched pit adjacent the etch-stop pit is prevented.

4. The method according to claim 1, wherein the substrate comprises single crystal silicon.

5. The method according to claim 1, wherein the first etch-stop pit comprises a vertical sidewall to provide a fiber stop.

6. The method according to claim 1, wherein the first wet-etched pit comprises an elongated pit and comprises a second sidewall portion that intersects the elongated pit at a non-orthogonal angle relative to a longitudinal axis of the elongated pit.

7. The method according to claim 1, wherein the reflection surface is a crystallographic plane of the substrate.

8. The method according to claim 1, comprising providing an optical fiber disposed in the groove.

* * * * *